(12) United States Patent
Toda

(10) Patent No.: US 12,096,642 B2
(45) Date of Patent: Sep. 17, 2024

(54) SOLID-STATE IMAGING DEVICE WITH ORGANIC PHOTOELECTRIC CONVERSION FILM OVER PHOTODIODES

(71) Applicant: SONY SEMICONDUCTOR SOLUTIONS CORPORATION, Kanagawa (JP)

(72) Inventor: Atsushi Toda, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 17/519,340

(22) Filed: Nov. 4, 2021

(65) Prior Publication Data
US 2022/0059620 A1 Feb. 24, 2022

Related U.S. Application Data

(63) Continuation of application No. 16/841,496, filed on Apr. 6, 2020, now Pat. No. 11,398,526, which is a
(Continued)

(30) Foreign Application Priority Data
Nov. 27, 2014 (JP) ................. 2014-240051

(51) Int. Cl.
H01L 27/30 (2006.01)
H01L 27/14 (2006.01)
(Continued)

(52) U.S. Cl.
CPC ............. *H10K 39/32* (2023.02); *H01L 27/14* (2013.01); *H01L 27/146* (2013.01);
(Continued)

(58) Field of Classification Search
CPC .................... H01L 27/307; H10K 39/32
See application file for complete search history.

(56) References Cited

U.S. PATENT DOCUMENTS 9,386,285 B2 7/2016 Okigawa
10,700,132 B2 6/2020 Toda
(Continued)

FOREIGN PATENT DOCUMENTS

JP 2006-229022 8/2006
JP 2006-270021 10/2006
(Continued)

OTHER PUBLICATIONS

International Search Report and Written Opinion for International (PCT) Patent Application No. PCT/JP2015/081998, dated Feb. 2, 2016, 8 pages.
(Continued)

Primary Examiner — Peter Bradford
(74) Attorney, Agent, or Firm — SHERIDAN ROSS P.C.

(57) ABSTRACT

The present disclosure relates to a solid-state imaging device that can achieve a high S/N ratio at a high sensitivity level without any decrease in resolution, and to an electronic apparatus. In the upper layer, the respective pixels of a photoelectric conversion unit that absorbs light of a first wavelength are tilted at approximately 45 degrees with respect to a square pixel array, and are two-dimensionally arranged in horizontal directions and vertical directions in an oblique array. The respective pixels of a photoelectric conversion unit that is sensitive to light of a second or third wavelength are arranged under the first photoelectric conversion unit. That is, pixels that are $\sqrt{2}$ times as large in size (twice as large in area) and are rotated 45 degrees are arranged in an oblique array. The present disclosure can be
(Continued)

applied to solid-state imaging devices that are used in imaging apparatuses, for example.

20 Claims, 31 Drawing Sheets

Related U.S. Application Data continuation of application No. 15/528,062, filed as application No. PCT/JP2015/081998 on Nov. 13, 2015, now Pat. No. 10,700,132.

(51) Int. Cl.
| | |
|---|---|
| H01L 27/146 | (2006.01) |
| H04N 5/374 | (2011.01) |
| H04N 25/13 | (2023.01) |
| H04N 25/17 | (2023.01) |
| H04N 25/70 | (2023.01) |
| H04N 25/702 | (2023.01) |
| H04N 25/76 | (2023.01) |
| H10K 19/20 | (2023.01) |
| H10K 39/32 | (2023.01) |

(52) U.S. Cl.
CPC .... *H01L 27/14603* (2013.01); *H01L 27/1461* (2013.01); *H01L 27/14621* (2013.01); *H01L 27/1464* (2013.01); *H01L 27/14665* (2013.01); *H04N 25/134* (2023.01); *H04N 25/136* (2023.01); *H04N 25/17* (2023.01); *H04N 25/70* (2023.01); *H04N 25/702* (2023.01); *H04N 25/76* (2023.01); *H10K 19/20* (2023.02); *H01L 27/14647* (2013.01); *H04N 25/13* (2023.01)

(56) References Cited

U.S. PATENT DOCUMENTS

| | | | |
|---|---|---|---|
| 11,398,526 B2 | 7/2022 | Toda | |
| 2003/0071943 A1 | 4/2003 | Choo et al. | |
| 2004/0178467 A1* | 9/2004 | Lyon | H01L 27/14603 |
| | | | 257/443 |
| 2008/0043125 A1 | 2/2008 | Kozlowski | |
| 2010/0155868 A1* | 6/2010 | Jang | H01L 27/14621 |
| | | | 257/E31.127 |
| 2011/0109776 A1* | 5/2011 | Kawai | H04N 25/76 |
| | | | 348/294 |
| 2011/0317048 A1 | 12/2011 | Bai et al. | |
| 2013/0293871 A1 | 11/2013 | Gruev | |
| 2014/0057043 A1* | 2/2014 | Cok | G06F 3/0446 |
| | | | 427/66 |
| 2014/0071244 A1 | 3/2014 | Hirota | |
| 2015/0001663 A1* | 1/2015 | Lee | H01L 27/14621 |
| | | | 257/432 |
| 2015/0163464 A1 | 6/2015 | Egawa et al. | |
| 2015/0312492 A1* | 10/2015 | Kim | H01L 27/14621 |
| | | | 348/308 |
| 2016/0049438 A1 | 2/2016 | Murata | |
| 2016/0203748 A1 | 7/2016 | Matsueda et al. | |
| 2016/0240571 A1 | 8/2016 | Baek | |
| 2018/0213170 A1 | 7/2018 | Segawa et al. | |
| 2019/0157360 A1 | 5/2019 | Tsukamoto et al. | |

FOREIGN PATENT DOCUMENTS

| | | | |
|---|---|---|---|
| JP | 2009-054806 | | 3/2009 |
| JP | 2010-272666 | | 12/2010 |
| KR | 20210034748 A | * | 2/2021 |
| WO | WO 2012/161225 | | 11/2012 |

OTHER PUBLICATIONS

Official Action for U.S. Appl. No. 15/528,062, dated Oct. 4, 2018, 7 pages.
Official Action for U.S. Appl. No. 15/528,062, dated May 1, 2019, 8 pages.
Official Action for U.S. Appl. No. 15/528,062, dated Aug. 8, 2019, 6 pages.
Notice of Allowance for U.S. Appl. No. 15/528,062, dated Jan. 10, 2020, 9 pages.
Corrected Notice of Allowance for U.S. Appl. No. 15/528,062, dated Jun. 4, 2020, 2 pages.
Official Action for U.S. Appl. No. 16/8411496, dated Oct. 6, 2021, 9 pages.
Notice of Allowance for U.S. Appl. No. 16/841,496, dated Mar. 7, 2022, 9 pages.
Updated Notice of Allowance for U.S. Appl. No. 16/841,496, dated Mar. 22, 2022, 2 pages.
Updated Notice of Allowance for U.S. Appl. No. 16/841,496, dated Mar. 31, 2022, 2 pages.
Supplemental Notice of Allowance for U.S. Appl. No. 16/841,496, dated Jun. 27, 2022, 5 pages.

* cited by examiner

FIG. 5
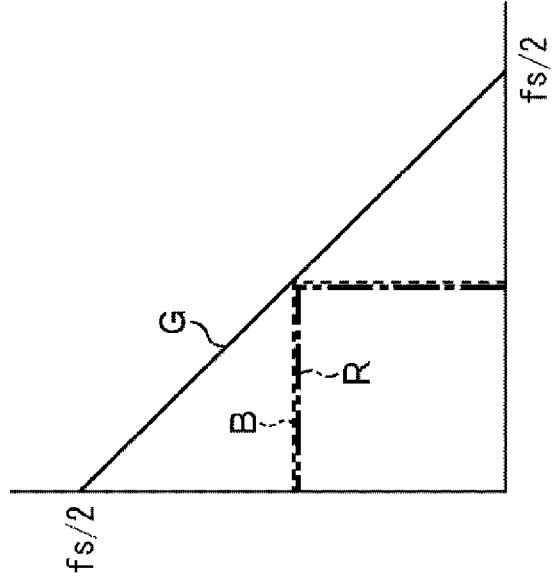
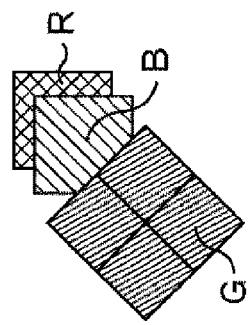
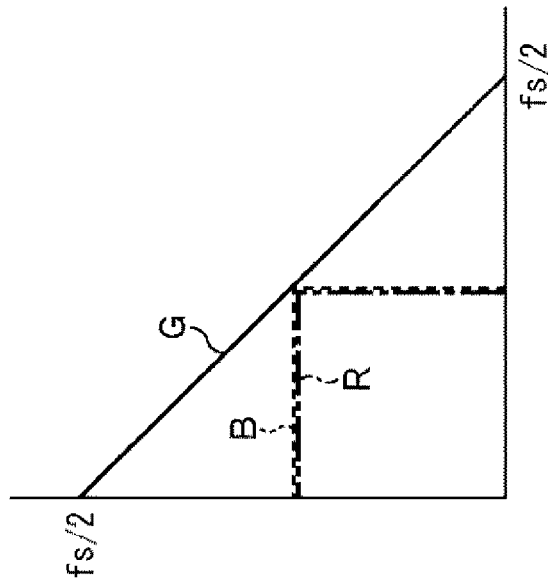
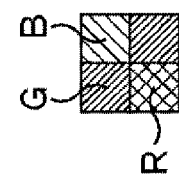

FIG. 26
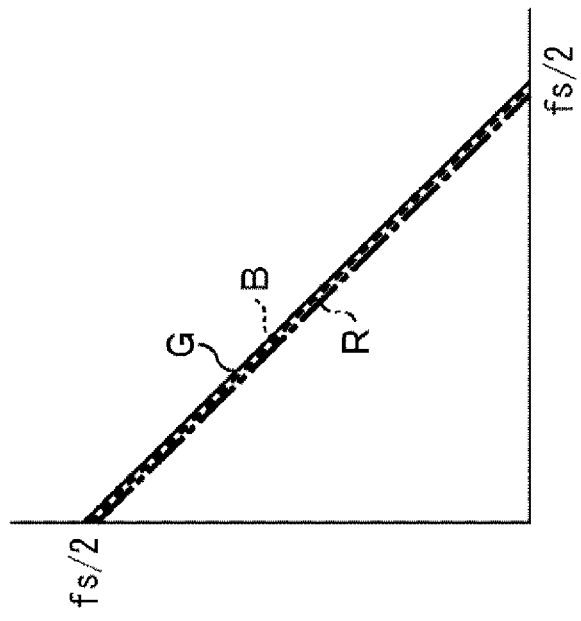 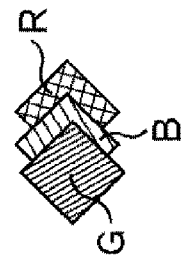
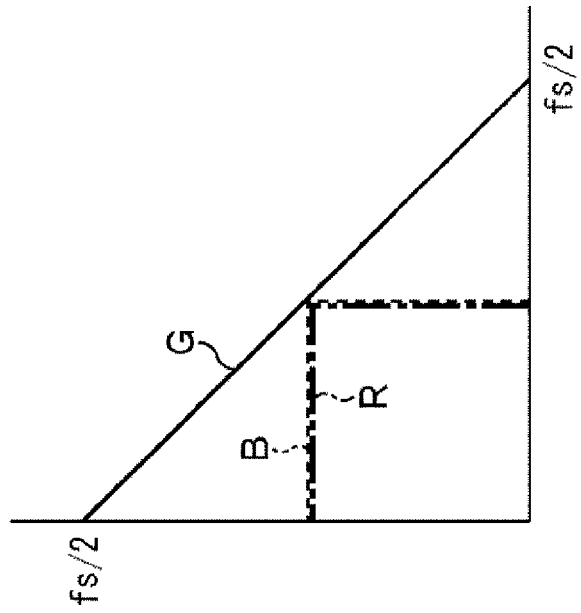 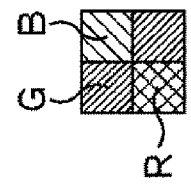

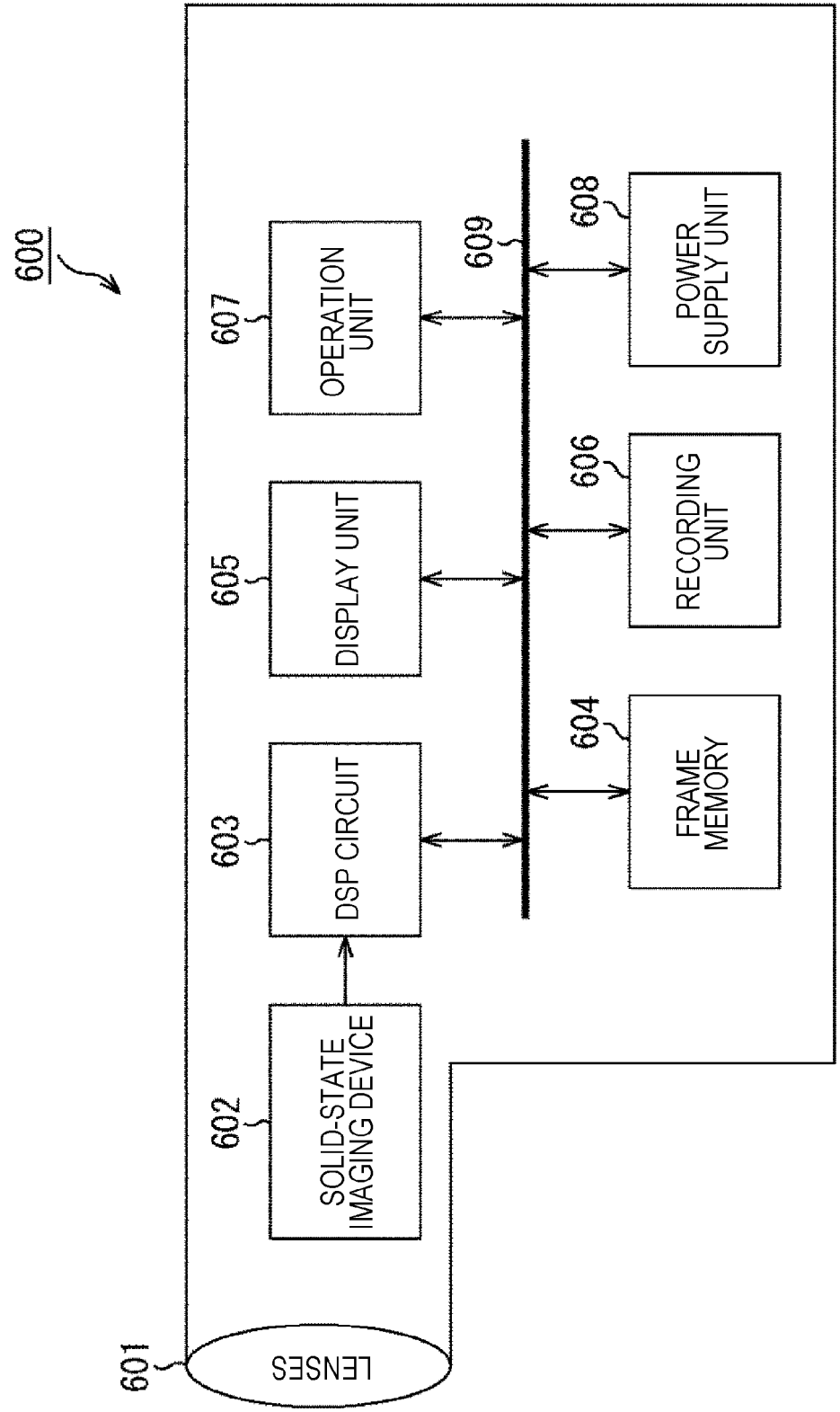

SOLID-STATE IMAGING DEVICE WITH ORGANIC PHOTOELECTRIC CONVERSION FILM OVER PHOTODIODES

CROSS REFERENCE TO RELATED APPLICATIONS

This application is a continuation of and claims priority to U.S. patent application Ser. No. 16/841,496, filed Apr. 6, 2020, which is a continuation of and claims priority to U.S. patent application Ser. No. 15/528,062 filed May 18, 2017, now U.S. Pat. No. 10,700,132, which is national stage application under 35 U.S.C. 371 and claims the benefit of PCT Application No. PCT/JP2015/081998 having an international filing date of Nov. 13, 2015, which designated the United States, which PCT application claimed the benefit of Japanese Patent Application No. 2014-240051 filed Nov. 27, 2014, the disclosures of which are incorporated herein by reference in their entirety.

TECHNICAL FIELD

The present disclosure relates to solid-state imaging devices and electronic apparatuses. More particularly, the present disclosure relates to a solid-state imaging device that can achieve a high S/N ratio at a high sensitivity level without any decrease in resolution, and to an electronic apparatus.

BACKGROUND ART

In three-layer vertical spectroscopy, a structure is formed with RGB photoelectric conversion units stacked in a vertical direction. In this case, the resolution is higher than in a Bayer array of the same pixel size, and images can be resolved with circular zone plate (CZP) frequency characteristics in a wider Nyquist domain.

CITATION LIST

Patent Document

Patent Document 1: U.S. Pat. No. 5,965,875

SUMMARY OF THE INVENTION

Problems to be Solved by the Invention

However, each pixel needs to have large numbers of transistors (Tr.), floating diffusions (FD), plugs, and the like for reading signals from the respective photoelectric conversion units, in addition to the other components. Therefore, the reduction in pixel size becomes difficult, and the process becomes complicated, resulting in higher production costs.

Meanwhile, where the pixel size is reduced, the photons that enter each pixel per unit time decrease. Therefore, the sensitivity becomes much lower, resulting in poor sensitivity.

The present disclosure is being made in view of those circumstances, and aims to achieve a high S/N ratio at a high sensitivity level, without any decrease in resolution.

Solutions to Problems

A solid-state imaging device of one aspect of the present technology includes: a first photoelectric conversion unit that converts light of a first wavelength and has respective pixels two-dimensionally arranged in a horizontal direction and a vertical direction, the respective pixels being tilted at approximately 45 degrees with respect to a square pixel array; and a second photoelectric conversion unit that converts light of a second wavelength and has respective pixels two-dimensionally arranged, the second photoelectric conversion unit being provided below the first photoelectric conversion unit.

The light of the first wavelength is green light, and the first photoelectric conversion unit is formed with an organic photoelectric conversion film.

The solid-state imaging device may further include a third photoelectric conversion unit that converts light of a third wavelength and has respective pixels two-dimensionally arranged, the third photoelectric conversion unit being provided below the first photoelectric conversion unit.

The light of the second wavelength or the light of the third wavelength is red light or blue light.

The second photoelectric conversion unit and the third photoelectric conversion unit have the respective pixels two-dimensionally arranged in a horizontal direction and a vertical direction, the respective pixels being tilted at the same angle with respect to a square pixel array.

The second photoelectric conversion unit and the third photoelectric conversion unit are arranged in a state tilted at approximately 0 degrees with respect to a square pixel array.

The second photoelectric conversion unit and the third photoelectric conversion unit are formed with Si semiconductors.

The second photoelectric conversion unit is formed with a Si semiconductor.

A filter that passes red light and a filter that passes blue light are provided between the first photoelectric conversion unit and the second photoelectric conversion unit, to cause a part of the second photoelectric conversion unit to function as a red photoelectric conversion unit, and another part of the second photoelectric conversion unit to function as a blue photoelectric conversion unit.

The red photoelectric conversion unit and the blue photoelectric conversion unit have the respective pixels two-dimensionally arranged in a horizontal direction and a vertical direction, the respective pixels being tilted at the same angle with respect to a square pixel array.

The red photoelectric conversion unit and the blue photoelectric conversion unit have the respective pixels arranged in a state tilted at approximately 45 degrees with respect to a square pixel array.

The red photoelectric conversion unit and the blue photoelectric conversion unit have a pixel array with the respective pixels arranged in a state tilted at approximately 0 degrees with respect to a square pixel array, to form no color filter on the pixels of yet another part of the second photoelectric conversion unit.

The solid-state imaging device may further include a lens between the first photoelectric conversion unit and the second photoelectric conversion unit.

The solid-state imaging device may further include a third photoelectric conversion unit that converts light of a third wavelength and has respective pixels two-dimensionally arranged, the third photoelectric conversion unit being provided above the first photoelectric conversion unit.

The light of the second wavelength or the light of the third wavelength is red light or blue light.

The second photoelectric conversion unit and the third photoelectric conversion unit have the respective pixels two-dimensionally arranged in a horizontal direction and a vertical direction, the respective pixels being tilted at the same angle with respect to a square pixel array.

The second photoelectric conversion unit and the third photoelectric conversion unit are arranged in a state tilted at approximately 0 degrees with respect to a square pixel array.

The second photoelectric conversion unit is formed with a Si semiconductor, and the third photoelectric conversion unit is formed with an organic photoelectric conversion film.

The second photoelectric conversion unit and the third photoelectric conversion unit are formed with organic photoelectric conversion films.

An electronic apparatus of one aspect of the present technology includes: a solid-state imaging device including: a first photoelectric conversion unit that converts light of a first wavelength and has respective pixels two-dimensionally arranged in a horizontal direction and a vertical direction, the respective pixels being tilted at approximately 45 degrees with respect to a square pixel array; and a second photoelectric conversion unit that converts light of a second wavelength and has respective pixels two-dimensionally arranged, the second photoelectric conversion unit being provided below the first photoelectric conversion unit; a signal processing circuit that processes an output signal output from the solid-state imaging device; and an optical system that inputs incident light to the solid-state imaging device.

In one aspect of the present technology, the respective pixels that form a first photoelectric conversion unit are tilted at approximately 45 degrees with respect to a square pixel array and are two-dimensionally arranged in a horizontal direction and a vertical direction, and the respective pixels forming a second photoelectric conversion unit that converts light of a second wavelength are two-dimensionally arranged below the first photoelectric conversion unit.

Effects of the Invention

According to the present technology, a high S/N ratio can be achieved at a high sensitivity level, without any decrease in resolution.

It should be noted that the advantageous effects described in this specification are merely examples, and the advantageous effects of the present technology are not limited to them and may include some additional effects.

BRIEF DESCRIPTION OF DRAWINGS

FIG. 5 is a diagram showing an example of CZP frequency characteristics in the first embodiment.

FIG. 26 is a cross-sectional view of an example device structure according to the seventh embodiment.

FIG. 31 is a diagram showing an example configuration of an electronic apparatus according to the present technology.

MODE FOR CARRYING OUT THE INVENTION

Figure 1:
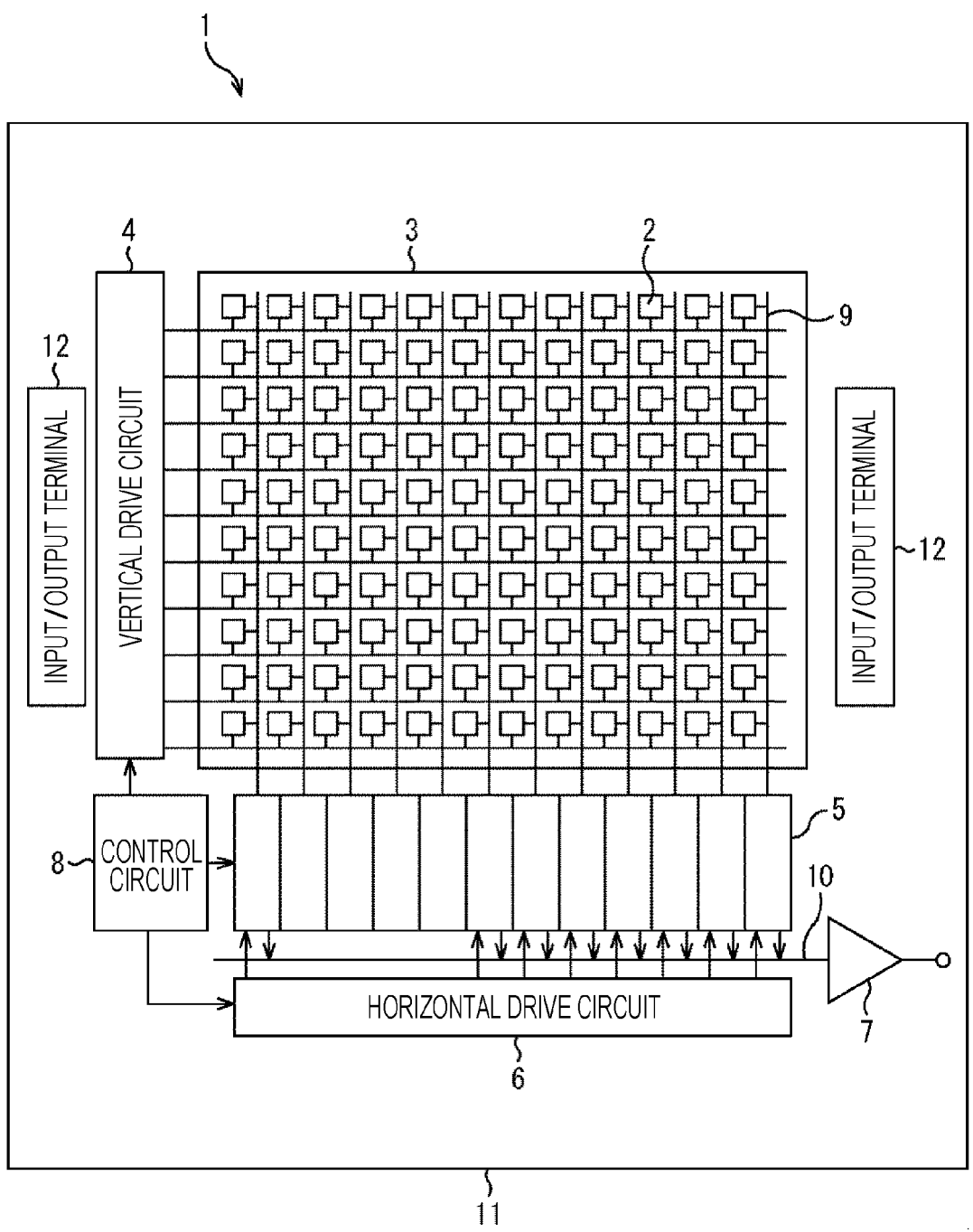
FIG. 1 is a block diagram showing a general example configuration of a solid-state imaging device to which the present technology is applied.

The following is a description of modes for carrying out the present disclosure (hereinafter referred to as embodiments). It should be noted that explanation will be made in the following order.

0. Outline
1. First Embodiment
2. Second embodiment
3. Third embodiment
4. Fourth embodiment
5. Fifth embodiment
6. Sixth embodiment
7. Seventh embodiment
8. Eighth embodiment
9. Ninth embodiment

0. Outline

<General Example Configuration of a Solid-State Imaging Device>

FIG. 1 shows a general example configuration of a complementary metal oxide semiconductor (CMOS) solid-state imaging device to be used in each embodiment of the present technology.

As shown in FIG. 1, a solid-state imaging device (a component chip) 1 includes a pixel region (or an imaging area) 3 and a peripheral circuit unit. In the pixel region 3, pixels 2 each having a photoelectric conversion element are two-dimensionally arranged with regularity on a semiconductor substrate 11 (a silicon substrate, for example).

A pixel 2 includes a photoelectric conversion element (a photodiode, for example) and pixel transistors (or MOS transistors). The pixel transistors may be formed with the three transistors consisting of a transfer transistor, a reset transistor, and an amplifying transistor, or may be formed with four transistors further including a select transistor. The equivalent circuit of each pixel 2 (unit pixel) is similar to a general one, and therefore, is not described in detail herein.

Alternatively, the pixels 2 may be a pixel sharing structure. The pixel sharing structure includes photodiodes, transfer transistors, one shared floating diffusion, and each shared one of other pixel transistors.

The peripheral circuit unit includes a vertical drive circuit 4, column signal processing circuits 5, a horizontal drive circuit 6, an output circuit 7, and a control circuit 8.

The control circuit 8 receives an input clock and data that designates an operation mode and the like, and also outputs data such as internal information about the solid-state imaging device 1. Specifically, the control circuit 8 generates a clock signal and a control signal that serve as the references for operations of the vertical drive circuit 4, the column signal processing circuits 5, and the horizontal drive circuit 6 on the basis of a vertical synchronization signal, a horizontal synchronization signal, and a master clock. The control circuit 8 then inputs these signals to the vertical drive circuit 4, the column signal processing circuits 5, and the horizontal drive circuit 6.

The vertical drive circuit 4 is formed with a shift register, for example. The vertical drive circuit 4 selects a pixel drive line, supplies a pulse for driving the pixels 2 connected to the selected pixel drive line, and drives the pixels 2 on a row-by-row basis. Specifically, the vertical drive circuit 4 sequentially selects and scans the respective pixels 2 in the pixel region 3 on a row-by-row basis in a vertical direction, and supplies pixel signals based on signal charges generated in accordance with the amounts of light received in the photoelectric conversion elements of the respective pixels 2, to the column signal processing circuits 5 through vertical signal lines 9.

The column signal processing circuits 5 are provided for the respective columns of the pixels 2, for example, and perform signal processing such as denoising, on a column-by-column basis, on signals that are output from the pixels 2 of one row. Specifically, the column signal processing circuits 5 perform signal processing, such as correlated double sampling (CDS) for removing fixed pattern noise inherent to the pixels 2, signal amplification, and analog/digital (A/D) conversion. Horizontal select switches (not shown) are provided between and connected to the output stages of the column signal processing circuits 5 and a horizontal signal line 10.

The horizontal drive circuit 6 is formed with a shift register, for example. The horizontal drive circuit 6 sequentially selects the respective column signal processing circuits 5 by sequentially outputting horizontal scan pulses, and causes the respective column signal processing circuits 5 to output pixel signals to the horizontal signal line 10.

The output circuit 7 performs signal processing on signals sequentially supplied from the respective column signal processing circuits 5 through the horizontal signal line 10, and outputs the processed signals. The output circuit 7 might perform only buffering, or might perform black level control, column variation correction, and various kinds of digital signal processing, for example.

Input/output terminals 12 are provided to exchange signals with the outside.

[Comparisons Between a Bayer Array and a Three-Layer Vertical Spectral Structure]

Figure 2:
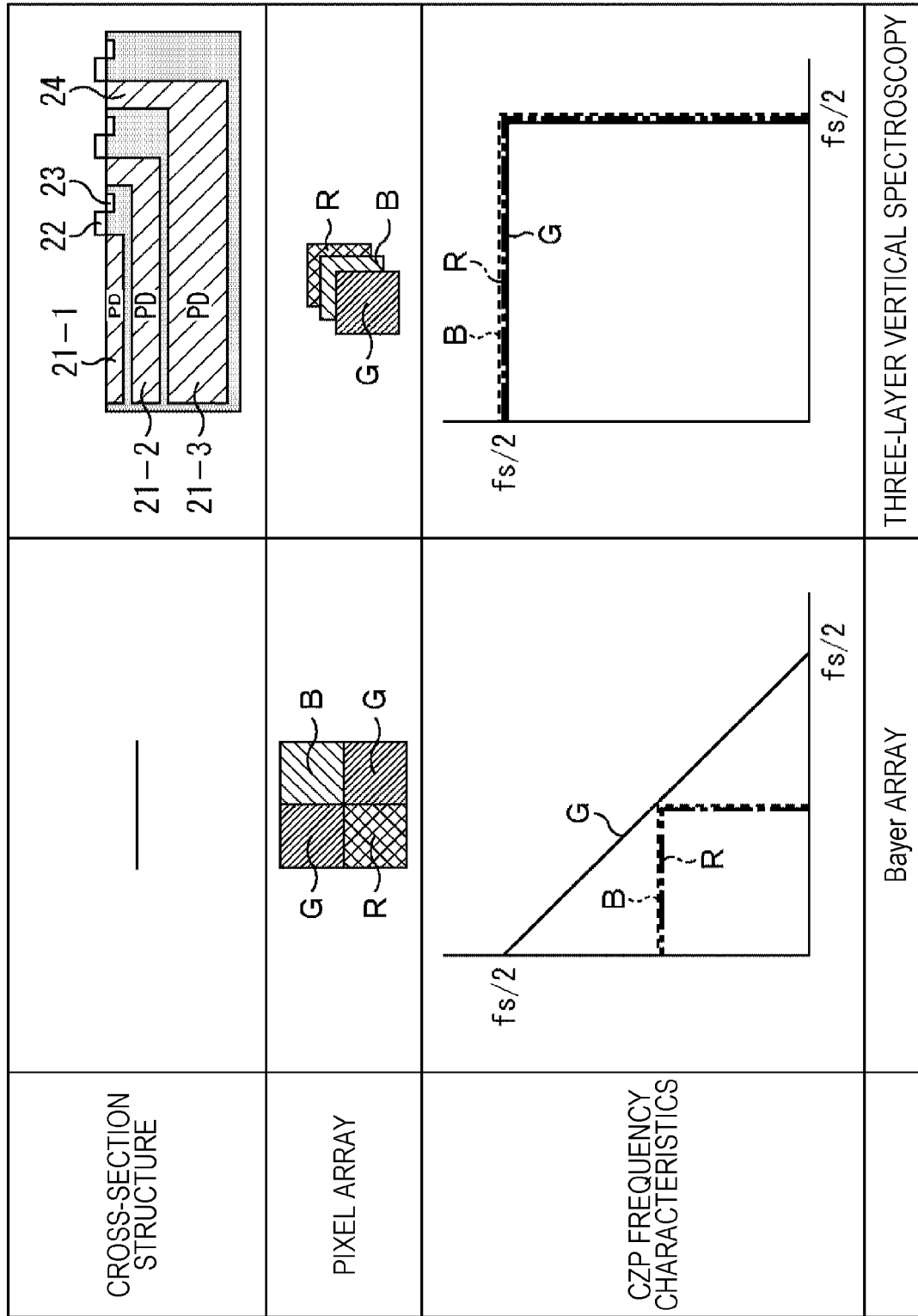
FIG. 2 is a diagram showing comparisons between a Bayer array and a three-layer vertical spectral structure.

FIG. 2 is a diagram showing comparisons between a Bayer array and a three-layer vertical spectral structure. In the example shown in FIG. 2, the left column shows a pixel array according to the Bayer array and its circular zone plate (CZP) frequency characteristics, and the right column shows a cross-section structure, the pixel array, and the CZP frequency characteristics of a three-layer vertical spectral structure.

As can be seen from the pixel arrays, while the respective photoelectric conversion units of RGB are horizontally arranged in the Bayer array, the respective photoelectric conversion units (PDs) of RGB are stacked in a vertical direction in the three-layer vertical spectral structure. The Bayer array has a pixel array parallel and perpendicular to the display screen, and is generally called a square array (a square pixel array).

As can be seen from the CZP frequency characteristics, the three-layer vertical spectral structure has a higher resolution than that in the Bayer array of the same pixel size. Specifically, in the three-layer vertical spectral structure, the resolutions of blue and red are twice higher than those in the Bayer array in vertical, horizontal, and oblique directions, and the resolution of green is almost the same as that in the Bayer array in the vertical and horizontal directions but is twice higher than that in the Bayer array in the oblique direction. It should be noted that fs represents the reciprocal of the pixel pitch of the Bayer array, and fs/2 represents Nyquist frequency.

In the three-layer vertical spectral structure, however, large numbers of transistors (Tr.) 22, floating diffusions (FDs) 23, plugs 24, and the like for reading signals from respective photoelectric conversion units 21-1 through 21-3 are necessary in one pixel, as indicated by the cross-section structure. Therefore, in the three-layer vertical spectral structure, the reduction in pixel size becomes difficult, and the process becomes complicated, resulting in higher production costs.

Meanwhile, where the pixel size is reduced, the photons that enter each pixel per unit time decrease. Therefore, the sensitivity becomes much lower, resulting in poor sensitivity.

To counter this with the present technology, the respective pixels of a first photoelectric conversion unit that absorbs a first wavelength are two-dimensionally arranged in a direction oblique to the respective directions of horizontal directions and vertical directions (or in a state tilted at approximately 45 degrees with respect to the Bayer square array (the display screen)) in the upper layer. Then, the respective pixels of a photoelectric conversion unit that are sensitive to light of a second or third wavelength are arranged under the first photoelectric conversion unit. It should be noted that, in the description below, the Bayer array will be referred to as a square array, and the structure with the above array will be referred to as an oblique-array vertical spectral structure.

[Outline of the Present Technology]

Figure 3:
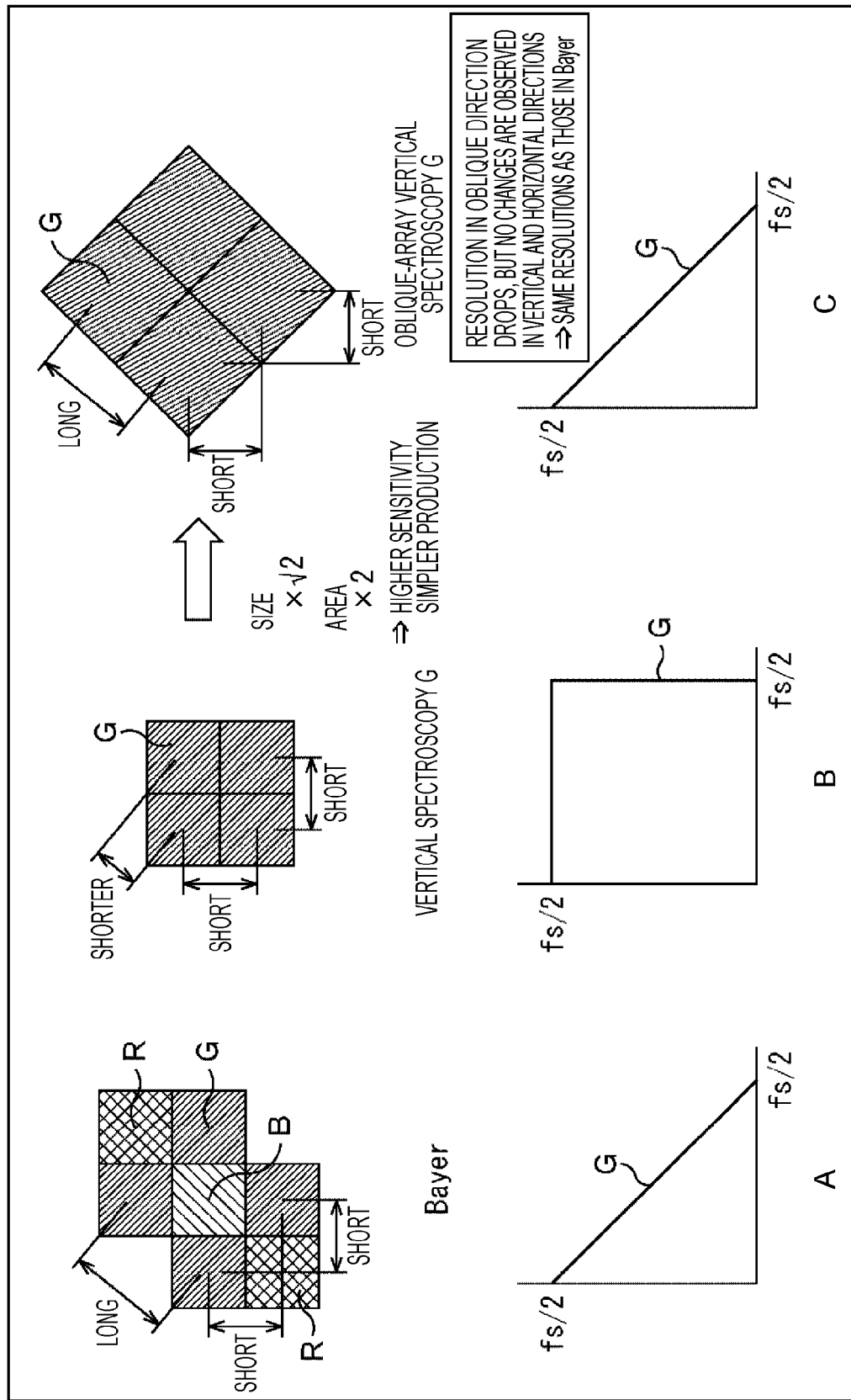
FIG. 3 is a diagram for explaining the outline of the present technology.

A through C of FIG. 3 are diagrams illustrating the outline of the present technology. In general, a photograph has more dividing lines in vertical and horizontal directions, and therefore, there is a demand for cameras with higher resolutions in vertical and horizontal directions than in oblique directions. Particularly, the human eye has, as a characteristic, a high resolution for green, and therefore, cameras are expected to have higher resolutions for green. In view of this, resolutions for green will be described below.

A of FIG. 3 is a diagram showing the Bayer pixel array and its CZP frequency characteristics. B of FIG. 3 is a diagram showing the green pixel array of vertical spectroscopy and its CZP frequency characteristics. C of FIG. 3 is a diagram showing the green pixel array of oblique-array vertical spectroscopy according to the present technology and its CZP frequency characteristics.

As shown in A of FIG. 3, in the case of green of the Bayer pixel array, the pitch fs in the vertical and horizontal directions are short, but the pitch in an oblique direction at 45 degrees is long. Accordingly, the Nyquist domain of the CZP frequency characteristics is large in the vertical and horizontal directions, and is small in the oblique direction.

Meanwhile, as shown in B of FIG. 3, in the case of green of the vertical spectroscopy, the pitch in the vertical and horizontal directions is the same as in Bayer, but the pitch in the oblique direction at 45 degrees is even shorter. Therefore, the Nyquist domain of the CZP frequency characteristics is wider in the oblique direction than in the vertical and horizontal directions.

As shown in C of FIG. 3, in the oblique-array vertical spectroscopy according to the present technology, on the other hand, pixels are √2 times larger in size (twice larger in area) than those in Bayer and in the vertical spectroscopy, and are obliquely arranged at 45 degrees to those in Bayer and in the vertical spectroscopy. In the oblique array, the horizontal and vertical directions are tilted at approximately 45 degrees with respect to those in the Bayer square array (or the display screen). In this situation, the Nyquist domain in the oblique direction is almost as small as that in Bayer, while the size of Nyquist domain in the vertical and horizontal directions is maintained. This means that, while the resolution is the same as that in Bayer, the S/N ratio is higher at a high sensitivity level, because the pixel size is larger. Since sensitivity increases with pixel area, the sensitivity in this situation is twice as high. As the pixel size is larger, the production process is also simplified, and production on a larger scale becomes possible.

Furthermore, as oblique pixels and square pixels are combined in the vertical spectroscopy, the center positions of upper and lower pixels differ from each other, and this difference between the pixels contributes to a further increase in resolution in signal processing, as described later in detail.

The following is a detailed description of the present technology.

1. First Embodiment

[Example of a Pixel Array According to the Present Technology]

Figure 4:
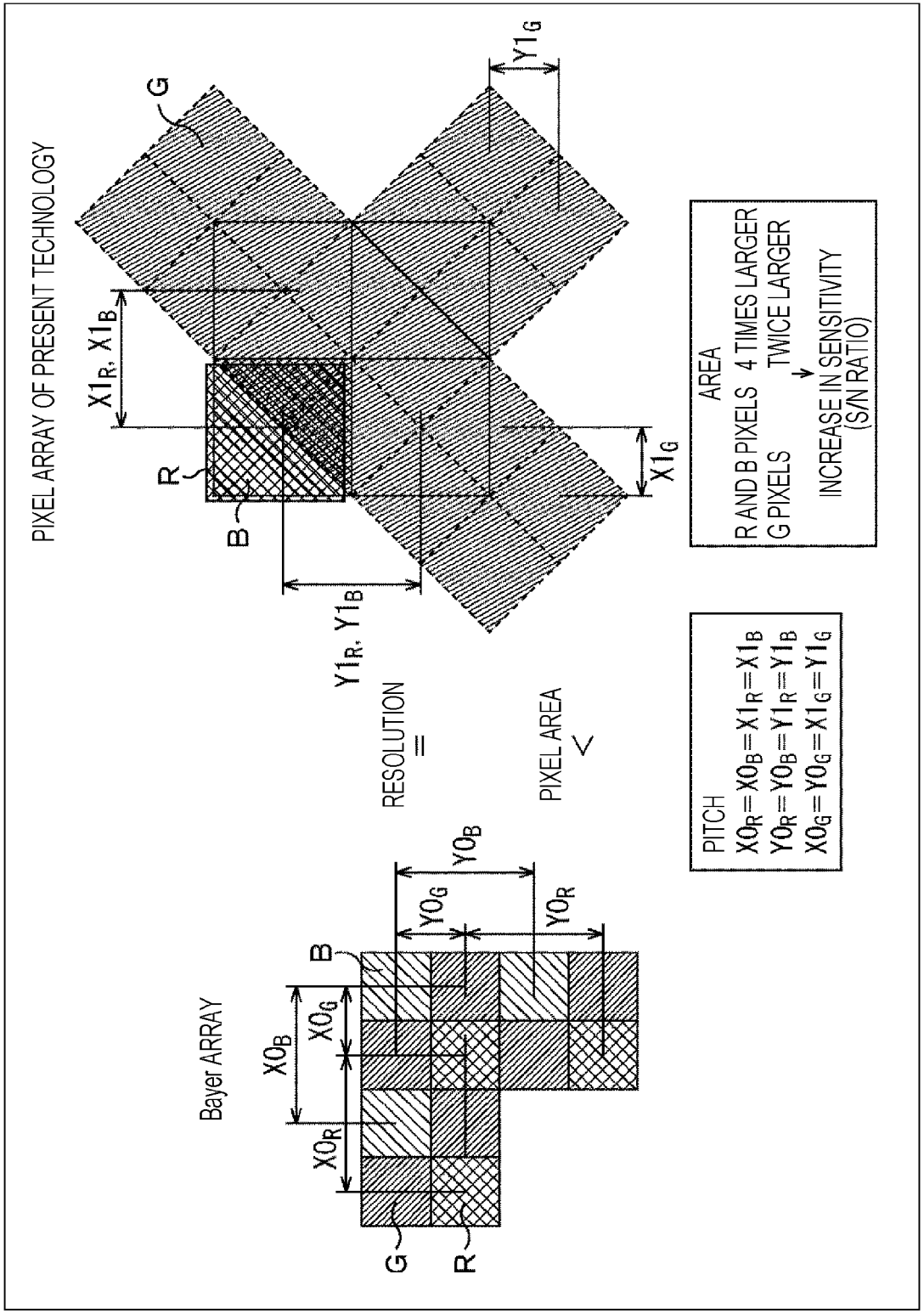
FIG. 4 is a diagram showing a first embodiment of a pixel array according to the present technology.

FIG. 4 is a diagram showing a first embodiment of a pixel array (an oblique array) according to the present technology. It should be noted that the example in FIG. 4 shows a Bayer array on the left side for comparison.

The pixel array shown in FIG. 4 is an oblique array in which the green pixels are √2 times larger in size (twice larger in area) than the green pixels in the Bayer array shown on the left side, and are arranged in an oblique direction at 45 degrees to those in the Bayer array. Further, in the pixel array shown in FIG. 4, the red pixels and the blue pixels are arranged in a square array like the Bayer array, are twice larger in size (four times larger in area), and are horizontally arranged.

Accordingly, the pitch $X0_R$ of the red pixels in the X-direction in the Bayer array=the pitch $X0_B$ of the blue pixels in the X-direction in the Bayer array=the pitch $X1_R$ of the red pixels in the X-direction in the oblique array of the present technology=the pitch $X1_B$ of the blue pixels in the X-direction in the oblique array of the present technology, as shown in FIG. 4. The pitch $Y0_R$ of the red pixels in the Y-direction in the Bayer array=the pitch $Y0_B$ of the blue pixels in the Y-direction in the Bayer array=the pitch $Y1_R$ of the red pixels in the Y-direction in the oblique array of the present technology=the pitch $Y1_B$ of the blue pixels in the Y-direction in the oblique array of the present technology.

The pitch $X0_G$ of the green pixels in the X-direction in the Bayer array=the pitch $Y0_G$ of the green pixels in the Y-direction in the Bayer array=the pitch $X1_G$ of the green pixels in the X-direction in the oblique array of the present technology=the pitch $Y1_G$ of the green pixels in the Y-direction in the oblique array of the present technology.

In this manner, the pixel pitch becomes equal to that in the Bayer array. Accordingly, in the oblique array of the present technology, the Nyquist domains of R, G, and B are the same in CZP frequency characteristics, as shown in FIG. 5, and consequently, the resolution becomes equal to that in the Bayer array.

It should be noted that, in the example shown in FIG. 5, the increase in resolution by virtue of the shifting of pixels is not taken into account. However, since the center positions of the upper and lower pixels (the green pixels and the red/blue pixels) in the vertical direction differ from each other, an effect similar to that to be achieved by shifting of pixel positions is achieved, and accordingly, the resolution can be increased through signal processing.

Also, the pixel sizes in the oblique array of the present technology are larger than that in the Bayer array. Specifically, the red pixels and the blue pixels are four times larger in pixel area, and are four times higher in sensitivity. The green pixels are twice larger in pixel area, and are twice higher in sensitivity.

Figure 6:
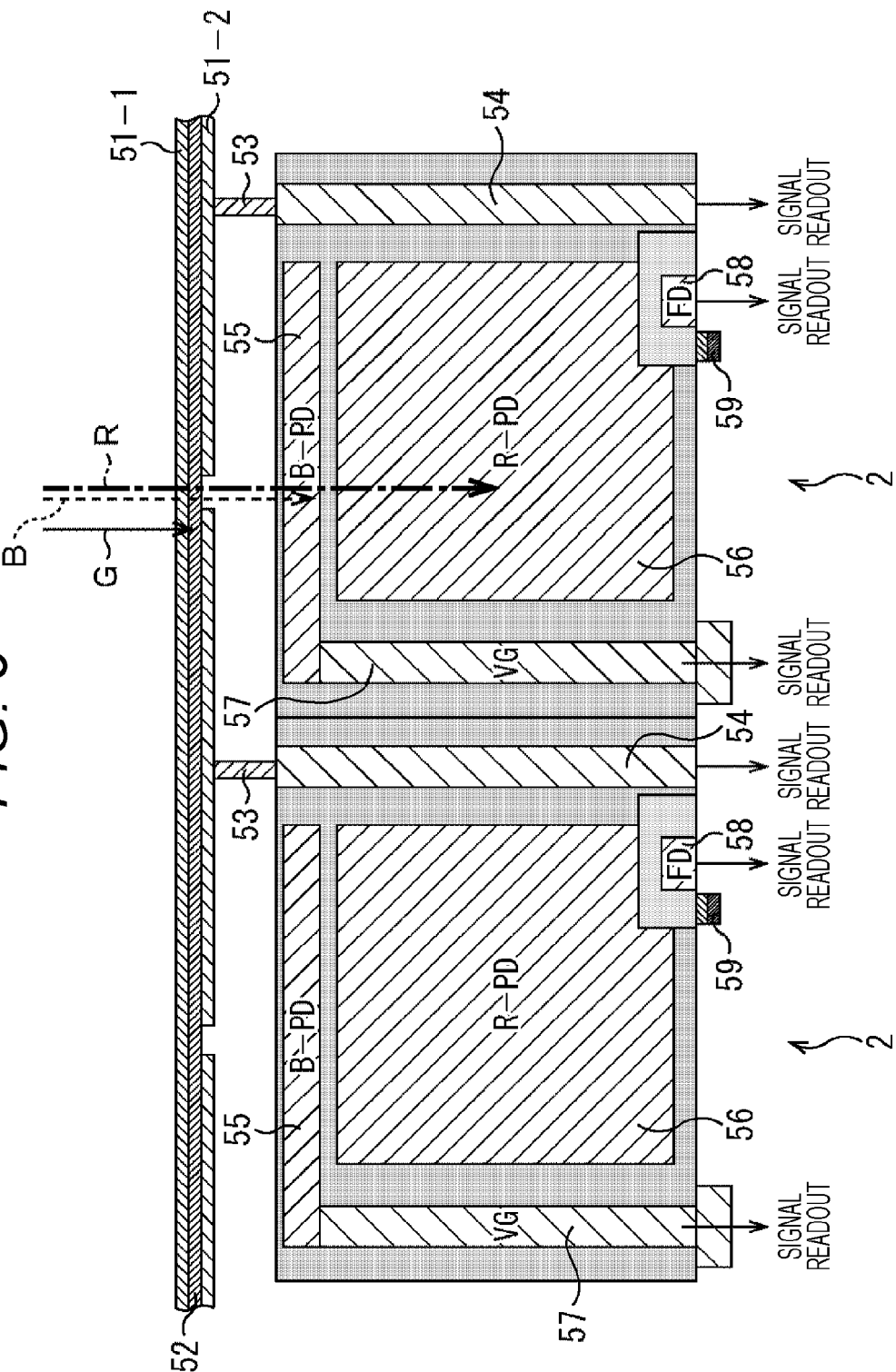
FIG. 6 is a cross-sectional view of an example device structure according to the first embodiment.
Figure 7:
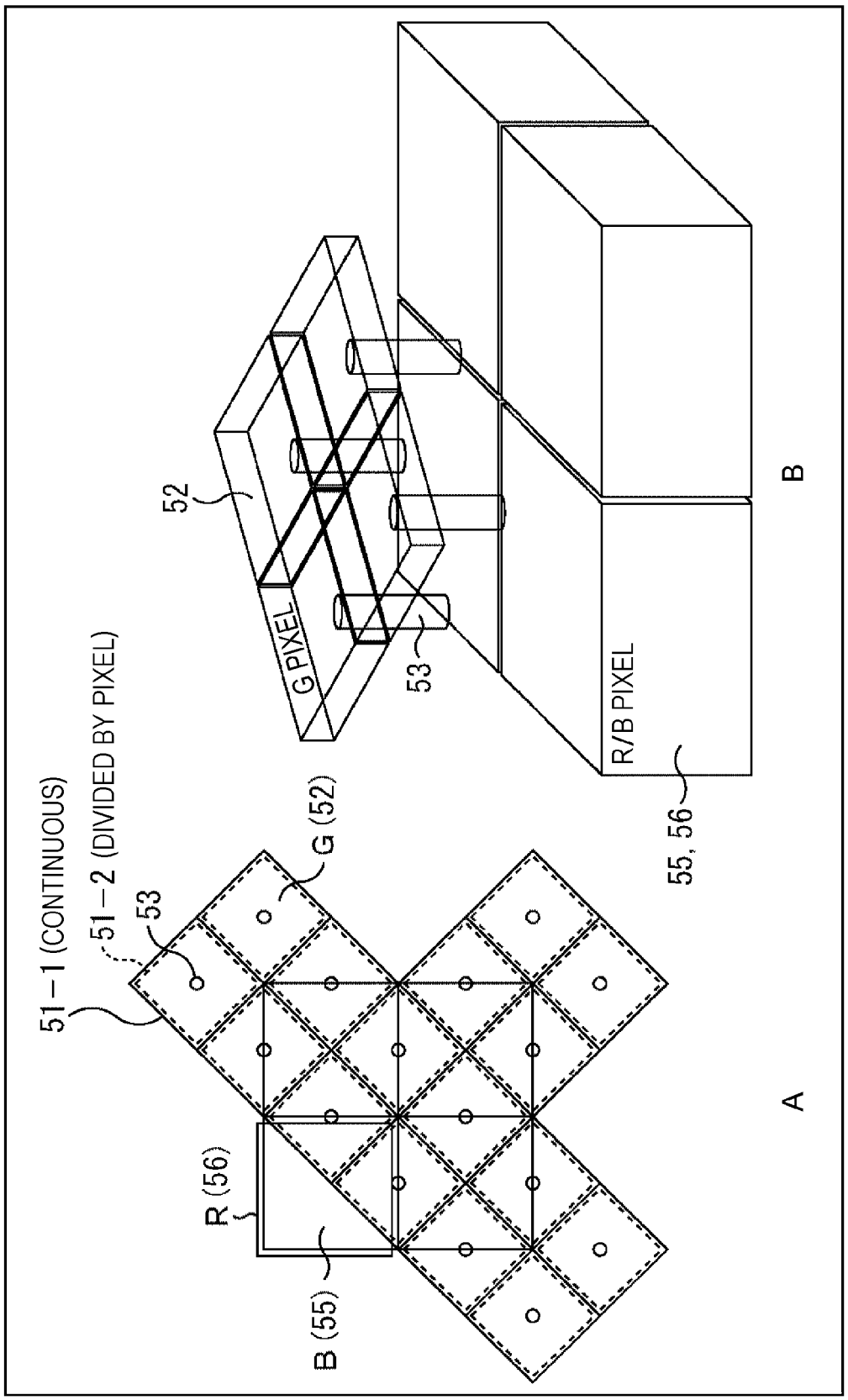
FIG. 7 is a diagram showing an example device structure according to the first embodiment.

FIG. 6 is a cross-sectional view of a device structure to which the present technology is applied. A of FIG. 7 is a top view of the device structure, and B of FIG. 7 is a bird's eye view.

The green pixels have an organic photoelectric conversion film structure that is formed with an organic photoelectric conversion film 52 that converts green light into signals and is interposed between an upper transparent electrode 51-1 and a lower transparent electrode 51-2, for example. The upper transparent electrode 51-1 is a continuous film, and the lower transparent electrode 51-2 is divided for the respective pixels. Through each of the divided electrodes, a green signal is read out. In this case, power supply plugs 53 for reading green signals into the Si substrate side (the lower side in the drawing) are arranged so as to be connected to the vicinities of the boundaries between the red/blue pixels on the Si substrate side by through electrodes 54, for example, as shown in A and B of FIG. 7. The through electrodes 54 are connected to FDs (not shown), from which green signals are read out to the Si substrate side. It should be noted that the power supply plugs 53 may be connected to the four corners of the pixels, instead of the boundaries of the pixels.

With this arrangement, sufficient light can enter the centers of the red/blue pixels, and sensitivity can be increased.

The blue pixels are formed with B-PDs (photodiodes) 55 that convert blue light into signals, for example, and the red pixels are formed with R-PDs 56 that convert red light into signals, for example. The B-PDs 55 are stacked on the R-PDs 56. The B-PDs 55 and the R-PDs 56 are formed with Si-PDs. Blue signals from the B-PDs 55 are read out to the Si substrate side via vertical gates (VGs) 57. Red signals from the R-PDs 56 are read out to the Si substrate side from FDs 58 formed adjacent to gates 59.

As such a device is manufactured, the red and blue pixels can be four times higher and the green pixels can be twice higher in sensitivity than those of the Bayer array of the same resolution, and thus, a high S/N ratio can be achieved.

2. Second Embodiment

[Another Example of a Pixel Array According to the Present Technology]

Figure 8:
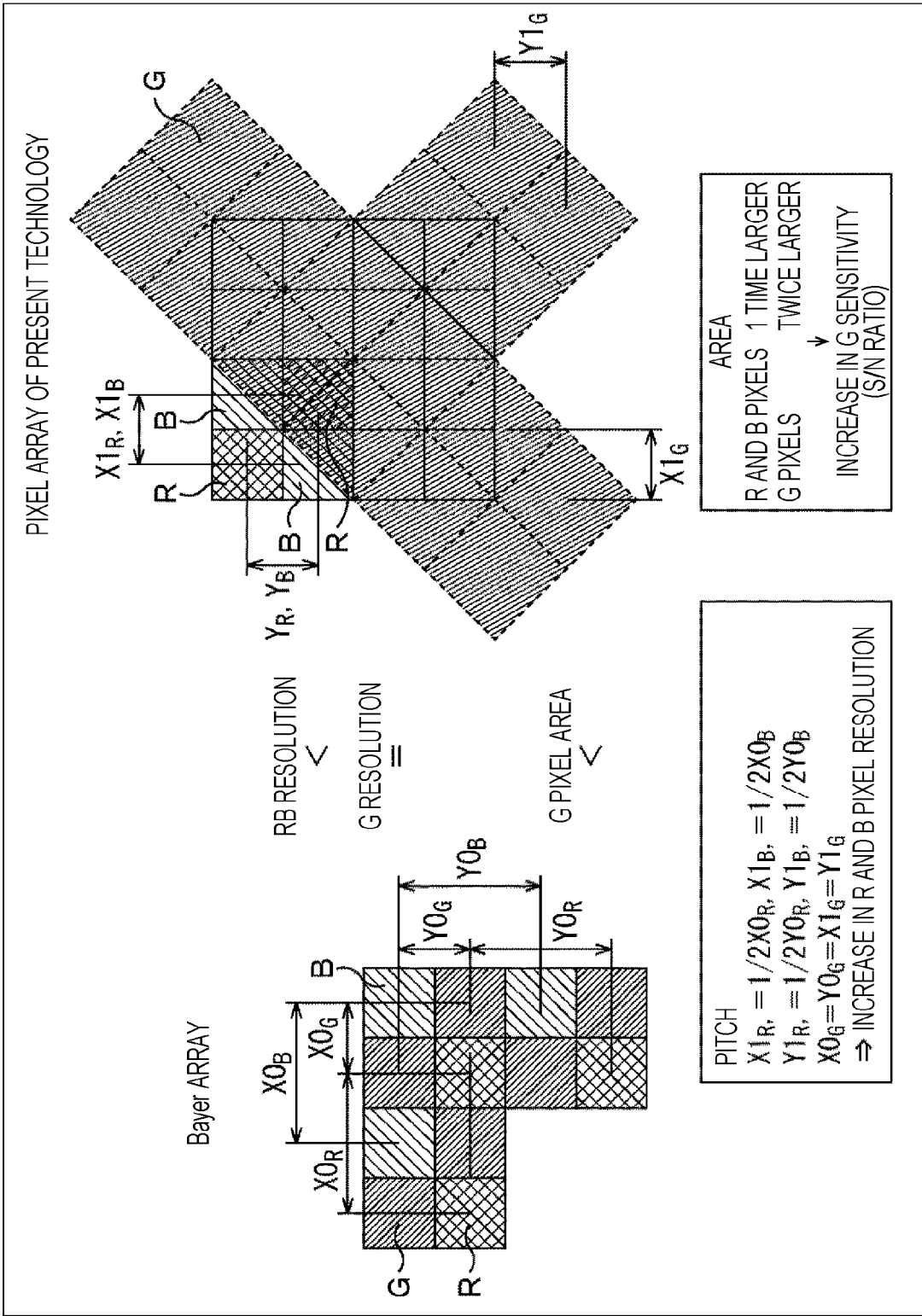
FIG. 8 is a diagram showing a second embodiment of a pixel array according to the present technology.

FIG. 8 is a diagram showing a second embodiment of a pixel array (an oblique array) according to the present technology. It should be noted that the example in FIG. 8 shows a Bayer array on the left side for comparison.

The pixel array shown in FIG. 8 is the same as the pixel array shown in FIG. 4 in being an oblique array in which the green pixels are √2 times larger in size (twice larger in area) than the green pixels in the Bayer array shown on the left side, and are arranged in an oblique direction at 45 degrees to those in the Bayer array. The pixel array shown in FIG. 4 is also the same as the pixel array shown in FIG. 4 in that the red pixels and the blue pixels are arranged in a square array and are horizontally arranged like the Bayer array. In the example shown in FIG. 8, however, the red pixels and the blue pixels are arranged in a checkerboard pattern. Meanwhile, unlike the red pixels and the blue pixels in the pixel array in FIG. 4, the red pixels and the blue pixel are one time larger in size (one time larger in area).

Accordingly, the pitch $X1_R$ of the red pixels in the X-direction in the oblique array of the present technology=the pitch $X0_R \times \frac{1}{2}$ of the red pixels in the X-direction in the Bayer array, and the pitch $X1_B$ of the blue pixels in the X-direction in the oblique array of the present technology=the pitch $X0_B \times \frac{1}{2}$ of the blue pixels in the X-direction in the Bayer array, as shown in FIG. 8. The pitch $Y1_R$ of the red pixels in the Y-direction in the oblique array of the present technology=the pitch $Y0_R \times \frac{1}{2}$ of the red pixels in the Y-direction in the Bayer array, and the pitch $Y1_B$ of the blue pixels in the Y-direction in the oblique array of the present technology=the pitch $Y0_B \times \frac{1}{2}$ of the blue pixels in the Y-direction in the Bayer array.

Also, the pitch $X0_G$ of the green pixels in the X-direction in the Bayer array=the pitch $Y0_G$ of the green pixels in the Y-direction in the Bayer array=the pitch $X1_G$ of the green pixels in the X-direction in the oblique array of the present technology=the pitch $Y1_G$ of the green pixels in the Y-direction in the oblique array of the present technology.

As described above, the pixel pitch of the red pixels and the blue pixels are half the pixel pitch of those in the Bayer array. Accordingly, in the oblique array of the present technology, the Nyquist domains of R and B are both twice larger in the vertical and horizontal directions in the CZP frequency characteristics, as shown in FIG. 9, and the resolution becomes higher than that in the Bayer array.

Figure 9:
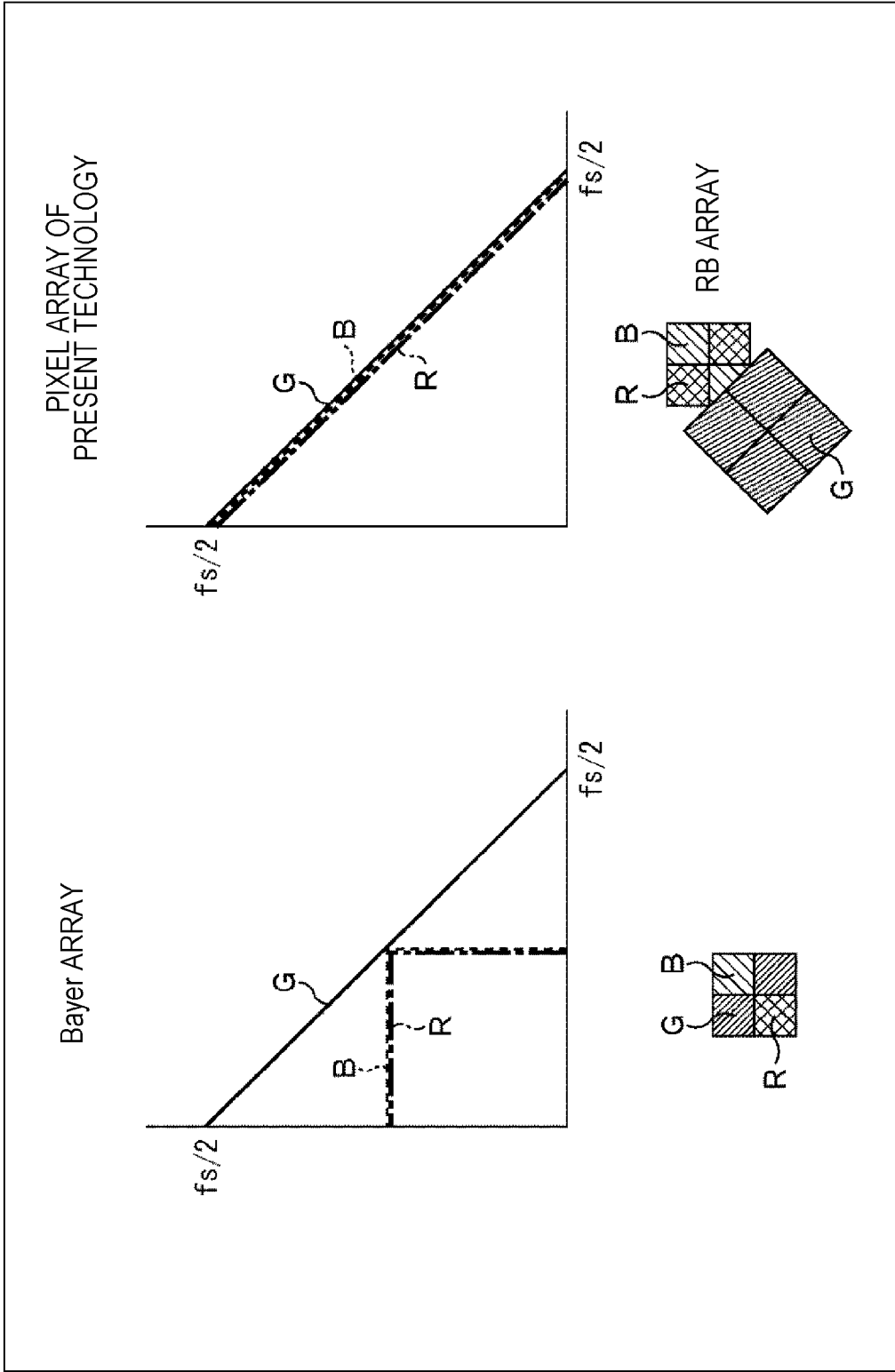
FIG. 9 is a diagram showing an example of CZP frequency characteristics in the second embodiment.

It should be noted that, in the example shown in FIG. 9, the increase in resolution by virtue of the shifting of pixels is not taken into account. However, since the center positions of the upper and lower pixels (the green pixels and the red/blue pixels) in the vertical direction differ from each other, an effect similar to that to be achieved by shifting of pixel positions is achieved, and accordingly, the resolution can be increased through signal processing.

Also, in the oblique array of the present technology, the green pixels are twice larger in pixel area, and the sensitivity is twice higher accordingly.

Figure 10:
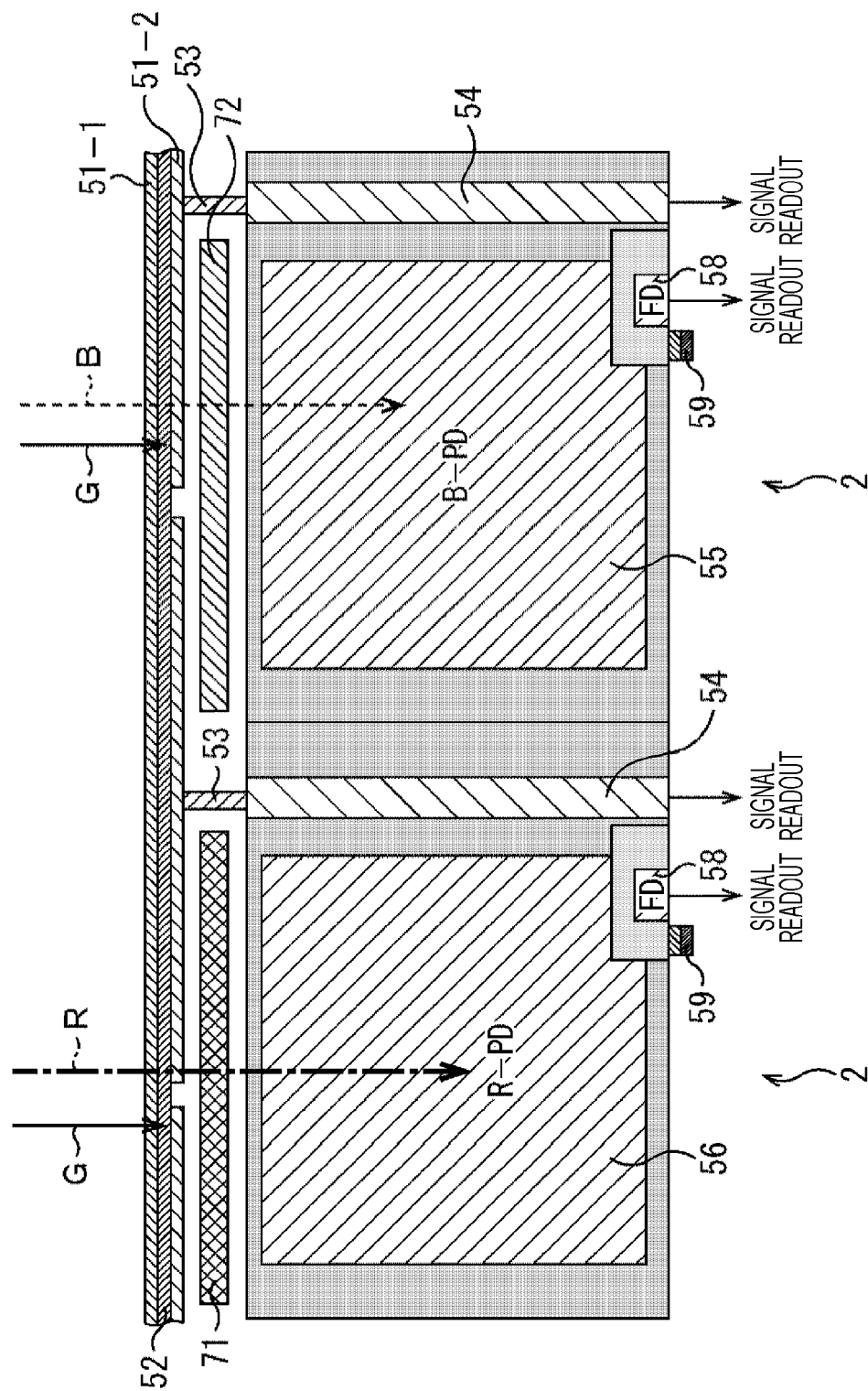
FIG. 10 is a cross-sectional view of an example device structure according to the second embodiment.

FIG. 10 is a cross-sectional view of a device structure to which the present technology is applied.

The example case shown in FIG. 10 is the same as the example case shown in FIG. 6 in including an upper transparent electrode 51-1, a lower transparent electrode 51-2, an organic photoelectric conversion film 52, power supply plugs 53, through electrodes 54, B-PDs 55, R-PDs 56, FDs 58, and gates 59. It should be noted that, while a B-PD 55 and a R-PD 56 are stacked in each one pixel in the example case shown in FIG. 6, a B-PD 55 and a R-PD 56 are arranged in pixels adjacent to each other in the example case shown in FIG. 10.

The example case shown in FIG. 10 also differs from the example case shown in FIG. 6 in that the VGs 57 are eliminated since the B-PDs 55 are not stacked on the R-PDs 56, and R-OCCFs (On Chip Color Filters) 71 and B-OCCFs 72 are added.

Specifically, the R-OCCFs 71 are red color filters. The R-OCCFs 71 are provided between the lower transparent electrode 51-2 and the R-PDs 56, and make the pixels of the R-PDs 56 the red pixels. The B-OCCFs 72 are blue color filters. The B-OCCFs 72 are provided between the lower transparent electrode 51-2 and the B-PDs 55, and make the pixels of the B-PDs 55 the blue pixels.

In this manner, the spectral characteristics are made closer to ideal spectroscopy, and the noise propagation at the time of color correction operation in signal processing can be reduced. As a result, an image with a high S/N ratio can be provided.

It should be noted that, although the color filters are blue and red filters in the above described example shown in FIG. 10, the blue filters may be replaced with cyan filters, because the green pixels formed with the organic photoelectric conversion film 52 have spectral transmission characteristics to absorb green light and accordingly serve as magenta filters. Similarly, the red filters may be replaced with yellow filters. Alternatively, both the blue and red filters may be replaced at the same time.

3. Third Embodiment

[Another Example of a Pixel Array According to the Present Technology]

Figure 11:
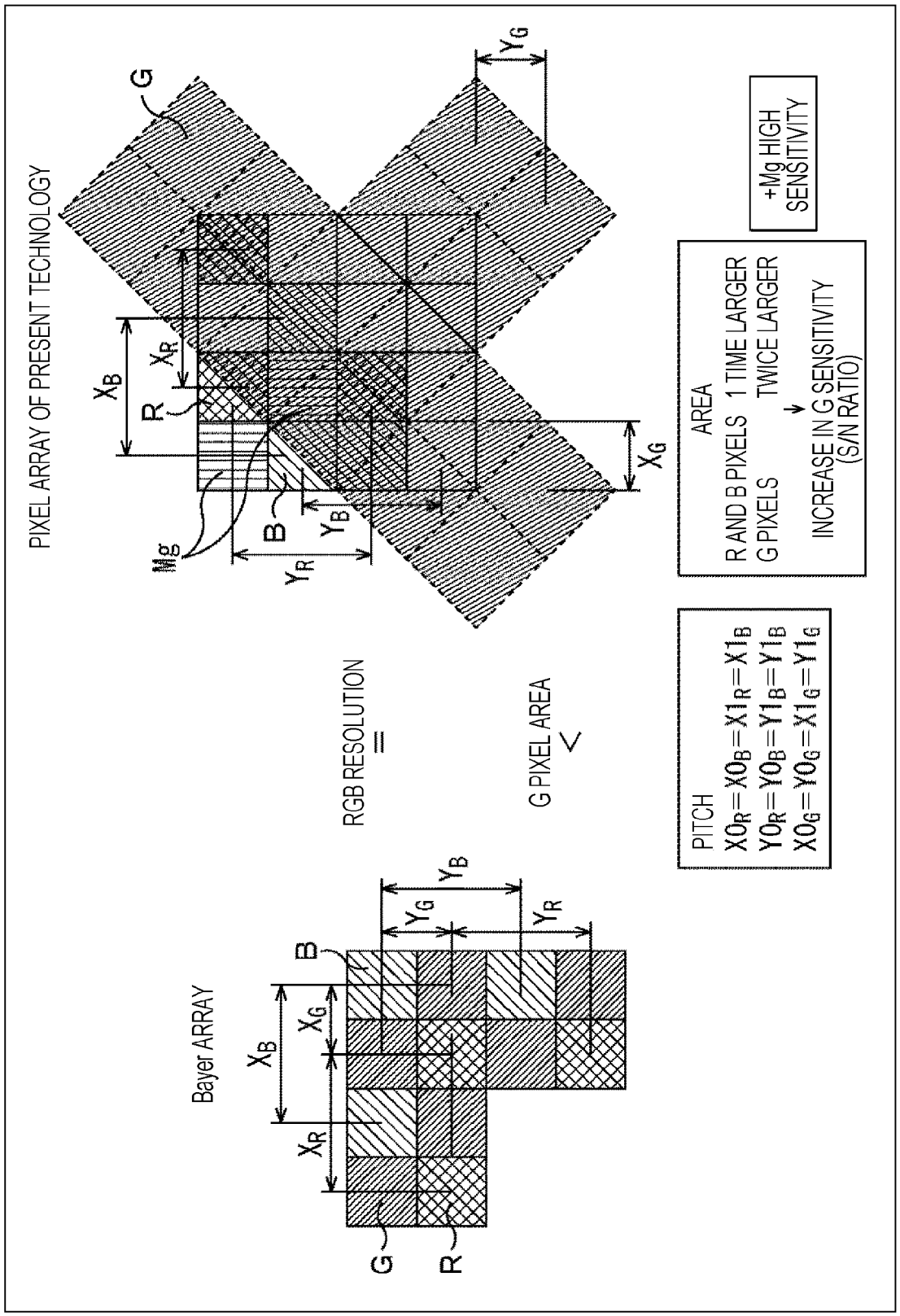
FIG. 11 is a diagram showing a third embodiment of a pixel array according to the present technology.

FIG. 11 is a diagram showing a third embodiment of a pixel array (an oblique array) according to the present technology. It should be noted that the example in FIG. 11 shows a Bayer array on the left side for comparison.

The pixel array shown in FIG. 11 is the same as the pixel array shown in FIG. 4 in being an oblique array in which the green pixels are √2 times larger in size (twice larger in area) than the green pixels in the Bayer array shown on the left side, and are arranged in an oblique direction at 45 degrees to those in the Bayer array. However, the pixel array shown in FIG. 4 differs from the pixel array shown in FIG. 4 in that, in addition to the red pixels and the blue pixels, magenta (Mg) pixels are arranged in a square array like the Bayer array, are one time larger in size (one time larger in area), and are horizontally arranged.

Accordingly, the pitch $X0_R$ of the red pixels in the X-direction in the Bayer array=the pitch $X0_B$ of the blue pixels in the X-direction in the Bayer array=the pitch $X1_R$ of the red pixels in the X-direction in the oblique array of the present technology=the pitch $X1_B$ of the blue pixels in the X-direction in the oblique array of the present technology, as shown in FIG. 11. The pitch $Y0_R$ of the red pixels in the Y-direction in the Bayer array=the pitch $Y0_B$ of the blue pixels in the Y-direction in the Bayer array=the pitch $Y1_R$ of the red pixels in the Y-direction in the oblique array of the present technology=the pitch $Y1_B$ of the blue pixels in the Y-direction in the oblique array of the present technology.

The pitch $X0_G$ of the green pixels in the X-direction in the Bayer array=the pitch $Y0_G$ of the green pixels in the Y-direction in the Bayer array=the pitch $X1_G$ of the green pixels in the X-direction in the oblique array of the present technology=the pitch $Y1_G$ of the green pixels in the Y-direction in the oblique array of the present technology.

Figure 12:
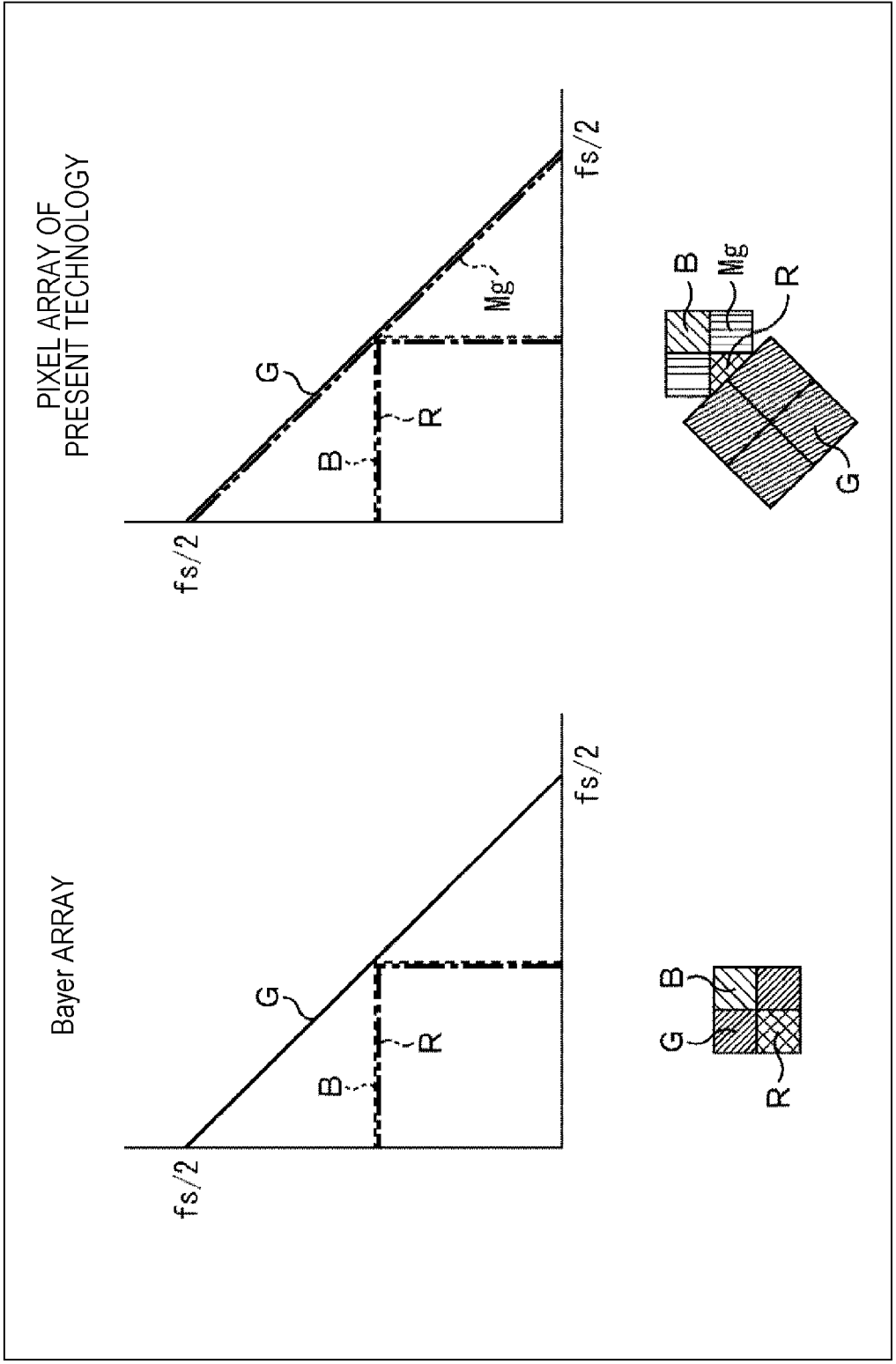
FIG. 12 is a diagram showing an example of CZP frequency characteristics in the third embodiment.

In this manner, the pixel pitch becomes equal to that in the Bayer array. Accordingly, in the oblique array of the present technology, the Nyquist domains of R, G, and B are the same in CZP frequency characteristics, as shown in FIG. 12, and consequently, the resolution becomes equal to that in the Bayer array. Also, as for the Mg pixels, the resolution is equal to that of the green pixels.

It should be noted that, in the example shown in FIG. 12, the increase in resolution by virtue of the shifting of pixels is not taken into account. However, since the center positions of the upper and lower pixels (the green pixels, and the red and blue/Mg pixels) in the vertical direction differ from each other, an effect similar to that to be achieved by shifting of pixel positions is achieved, and accordingly, the resolution can be increased through signal processing.

Also, in the oblique array of the present technology, the green pixels are twice larger in pixel area, and the sensitivity is twice higher accordingly. Furthermore, as the Mg pixels exhibit a high light transmission rate for visible light, the sensitivity can be increased through arithmetic processing using signals from these pixels.

Figure 13:
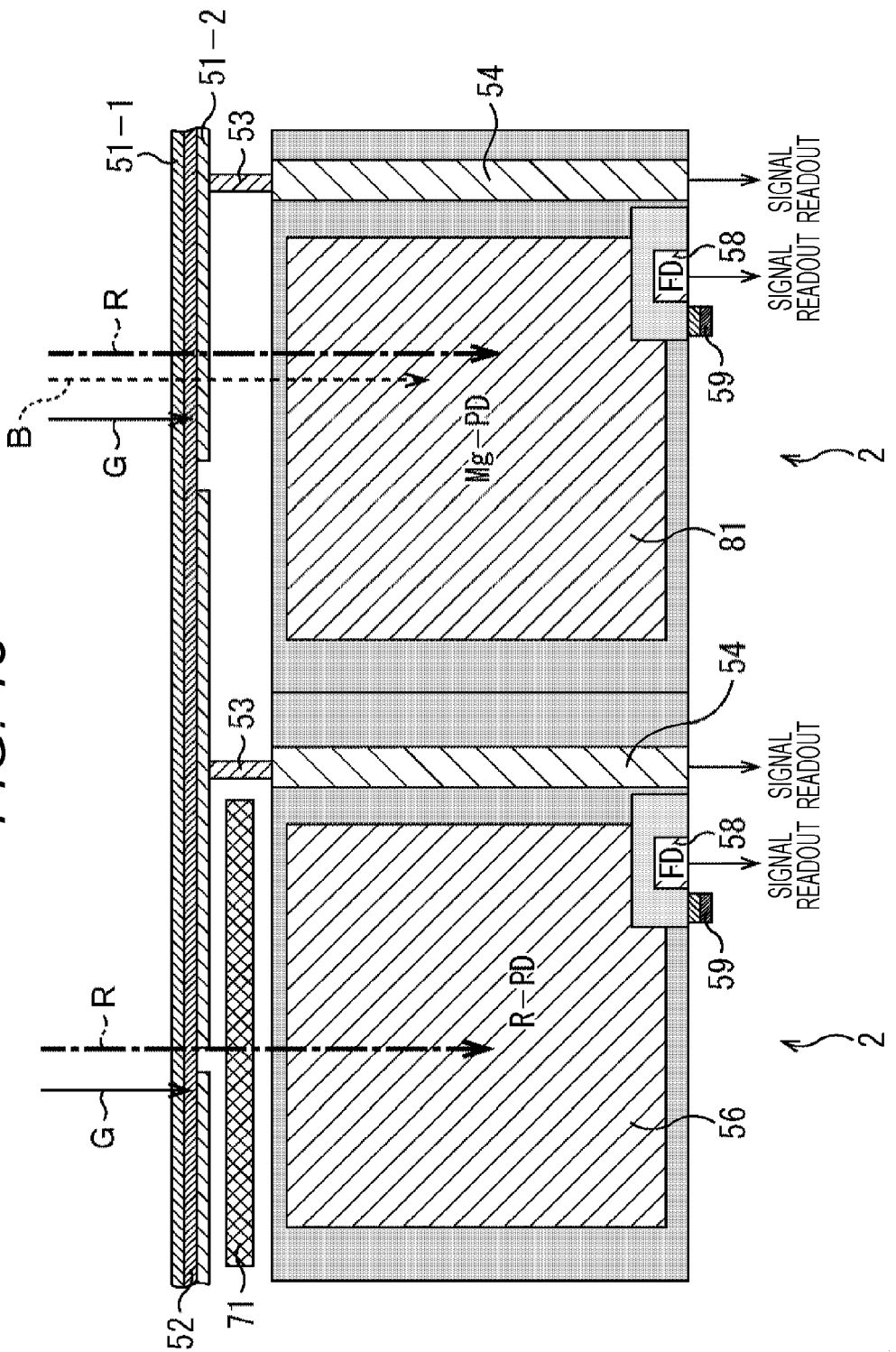
FIG. 13 is a cross-sectional view of an example device structure according to the third embodiment.

FIG. 13 is a cross-sectional view of a device structure to which the present technology is applied. It should be noted that, since only two pixels are shown in the example in FIG. 13, the B-PDs 55 and the B-OCCFs 72 are not shown. In practice, the blue pixels formed with the B-OCCFs 72 and the B-PDs 55 as shown in FIG. 10 are also provided in the example shown in FIG. 13.

The example case shown in FIG. 13 is the same as the example case shown in FIG. 10 in including an upper transparent electrode 51-1, a lower transparent electrode 51-2, an organic photoelectric conversion film 52, power supply plugs 53, through electrodes 54, B-PDs 55, R-PDs 56, FDs 58, gates 59, R-OCCFs 71, and B-OCCFs 72.

The example case shown in FIG. 13 differs from the example case shown in FIG. 10 in that Mg-PDs 81 are added. The Mg-PDs 81 form the Mg pixels, and Mg signals from the Mg-PDs 81 are read out from the FDs 58 formed adjacent to the gates 59, to the Si substrate side. It should be noted that any OCCFs are not provided for the Mg-PDs 81.

In the example shown in FIG. 13, as the blue and red color filters are provided, the spectral characteristics are made closer to ideal spectroscopy, and the noise propagation at the time of color correction operation in signal processing can be reduced, in a similar manner to the example shown in FIG. 10. As a result, an image with a high S/N ratio can be provided.

It should be noted that, although the color filters are blue and red filters in the above described example shown in FIG. 13, the blue filters may be replaced with cyan filters, because the green pixels formed with the organic photoelectric conversion film 52 have spectral transmission characteristics to absorb green light and accordingly serve as magenta filters. Similarly, the red filters may be replaced with yellow filters. Alternatively, both the blue and red filters may be replaced at the same time.

4. Fourth Embodiment

[Another Example of a Pixel Array According to the Present Technology]

Figure 14:
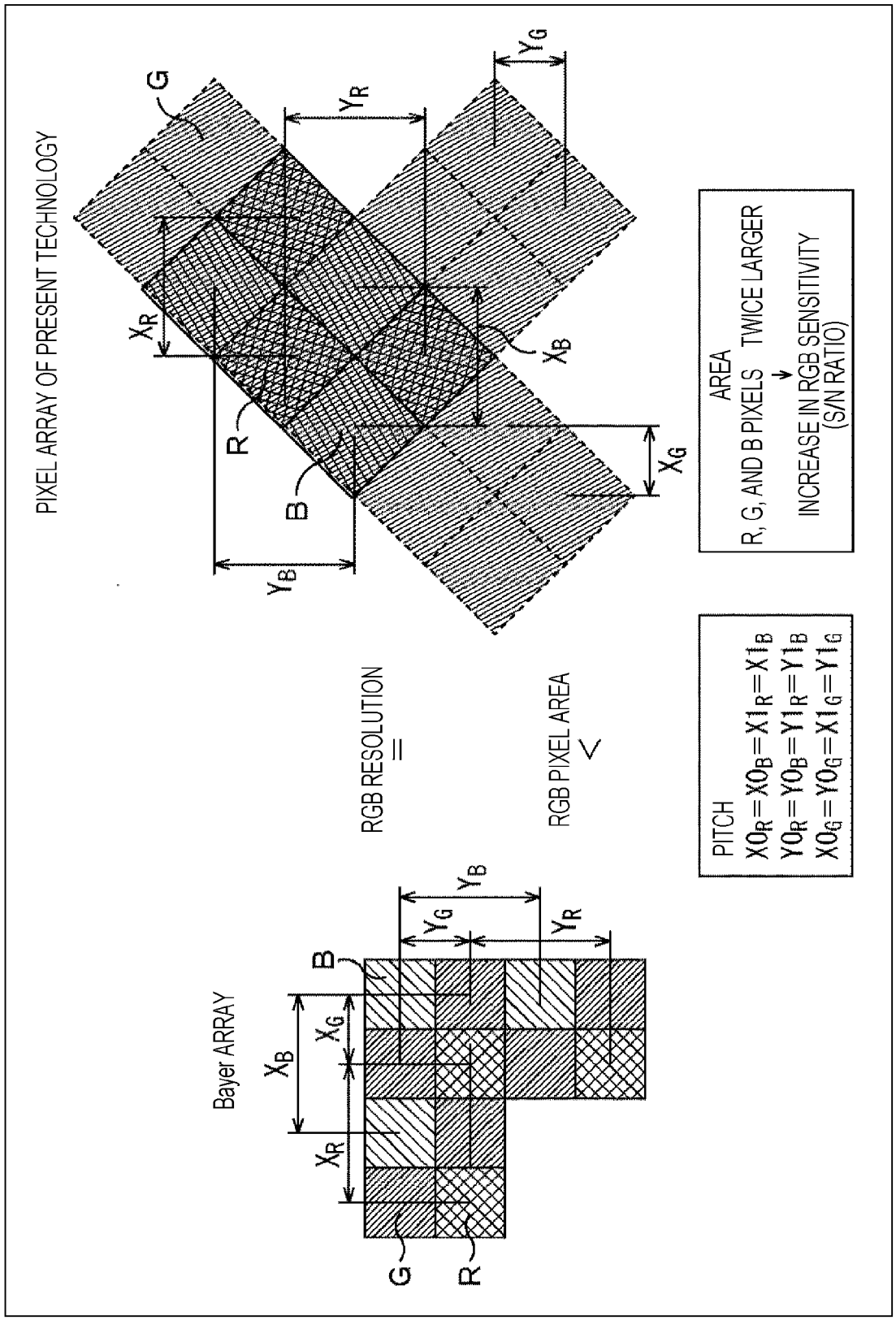
FIG. 14 is a diagram showing a fourth embodiment of a pixel array according to the present technology.

FIG. 14 is a diagram showing a fourth embodiment of a pixel array (an oblique array) according to the present technology. It should be noted that the example in FIG. 14 shows a Bayer array on the left side for comparison.

The pixel array shown in FIG. 14 is an oblique array in which all the green, red, and blue pixels are $\sqrt{2}$ times larger in size (twice larger in area) than the pixels in the Bayer array shown on the left side, and are arranged in an oblique direction at 45 degrees to the pixels in the Bayer array. Only the green pixels are formed in the upper layer, and the blue pixels and the red pixels are horizontally arranged in a checkerboard pattern in the lower layer.

Accordingly, the pitch $X0_R$ of the red pixels in the X-direction in the Bayer array=the pitch $X0_B$ of the blue pixels in the X-direction in the Bayer array=the pitch $X1_R$ of the red pixels in the X-direction in the oblique array of the present technology=the pitch $X1_B$ of the blue pixels in the X-direction in the oblique array of the present technology, as shown in FIG. 14. The pitch $Y0_R$ of the red pixels in the Y-direction in the Bayer array=the pitch $Y0_B$ of the blue pixels in the Y-direction in the Bayer array=the pitch $Y1_R$ of the red pixels in the Y-direction in the oblique array of the present technology=the pitch $Y1_B$ of the blue pixels in the Y-direction in the oblique array of the present technology.

The pitch $X0_G$ of the green pixels in the X-direction in the Bayer array=the pitch $Y0_G$ of the green pixels in the Y-direction in the Bayer array=the pitch $X1_G$ of the green pixels in the X-direction in the oblique array of the present technology=the pitch $Y1_G$ of the green pixels in the Y-direction in the oblique array of the present technology.

Figure 15:
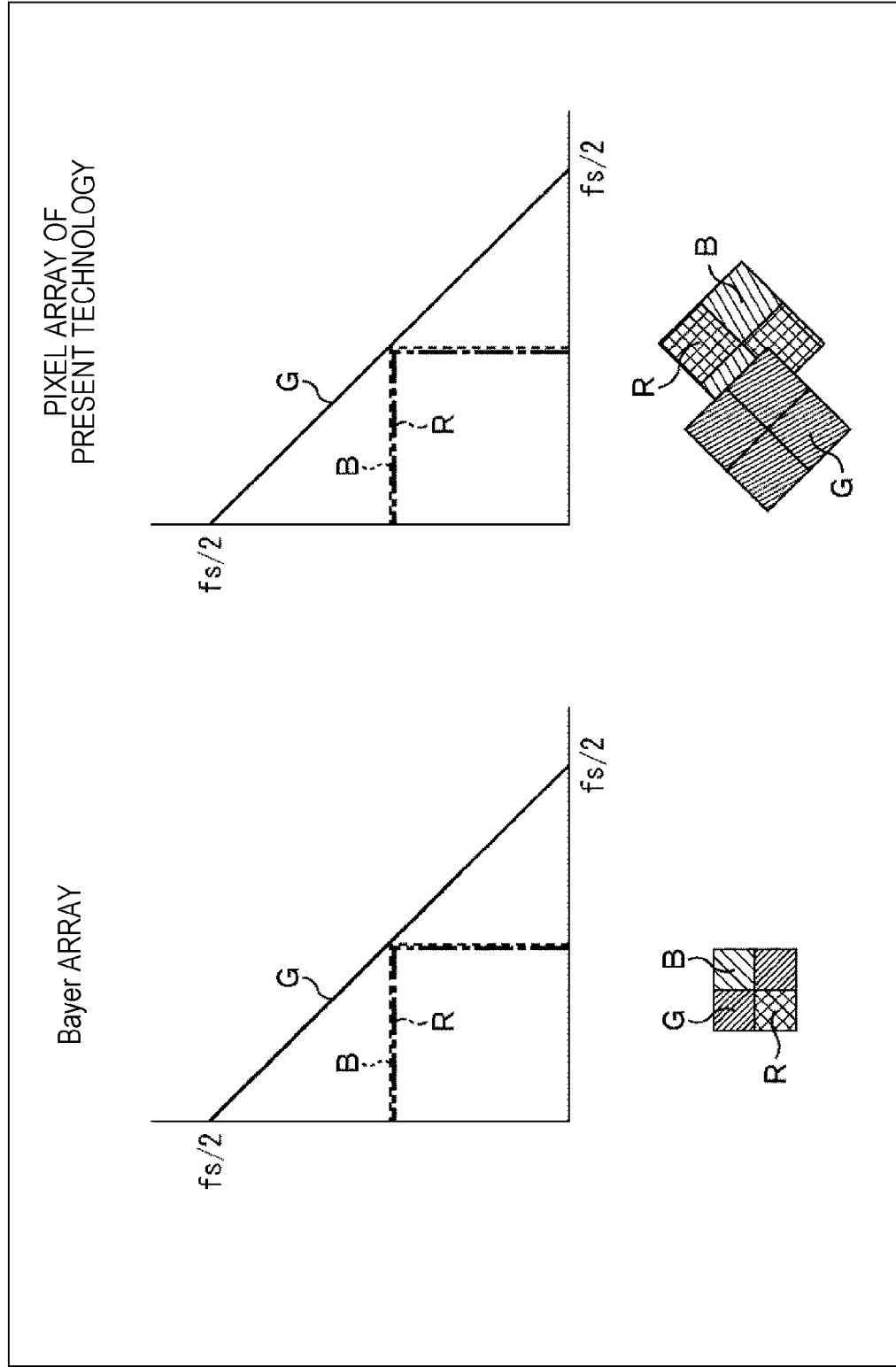
FIG. 15 is a diagram showing an example of CZP frequency characteristics in the fourth embodiment.

In this manner, the pixel pitch becomes equal to that in the Bayer array. Accordingly, in the oblique array of the present technology, the Nyquist domains of R, G, and B are the same in CZP frequency characteristics, as shown in FIG. 15, and consequently, the resolution becomes equal to that in the Bayer array.

Also, in the example shown in FIG. 14, the pixel size in the oblique array of the present technology is larger than that in the Bayer array. Specifically, all the red, green, and blue pixels are twice larger in pixel area, and are twice higher in sensitivity.

Figure 16:
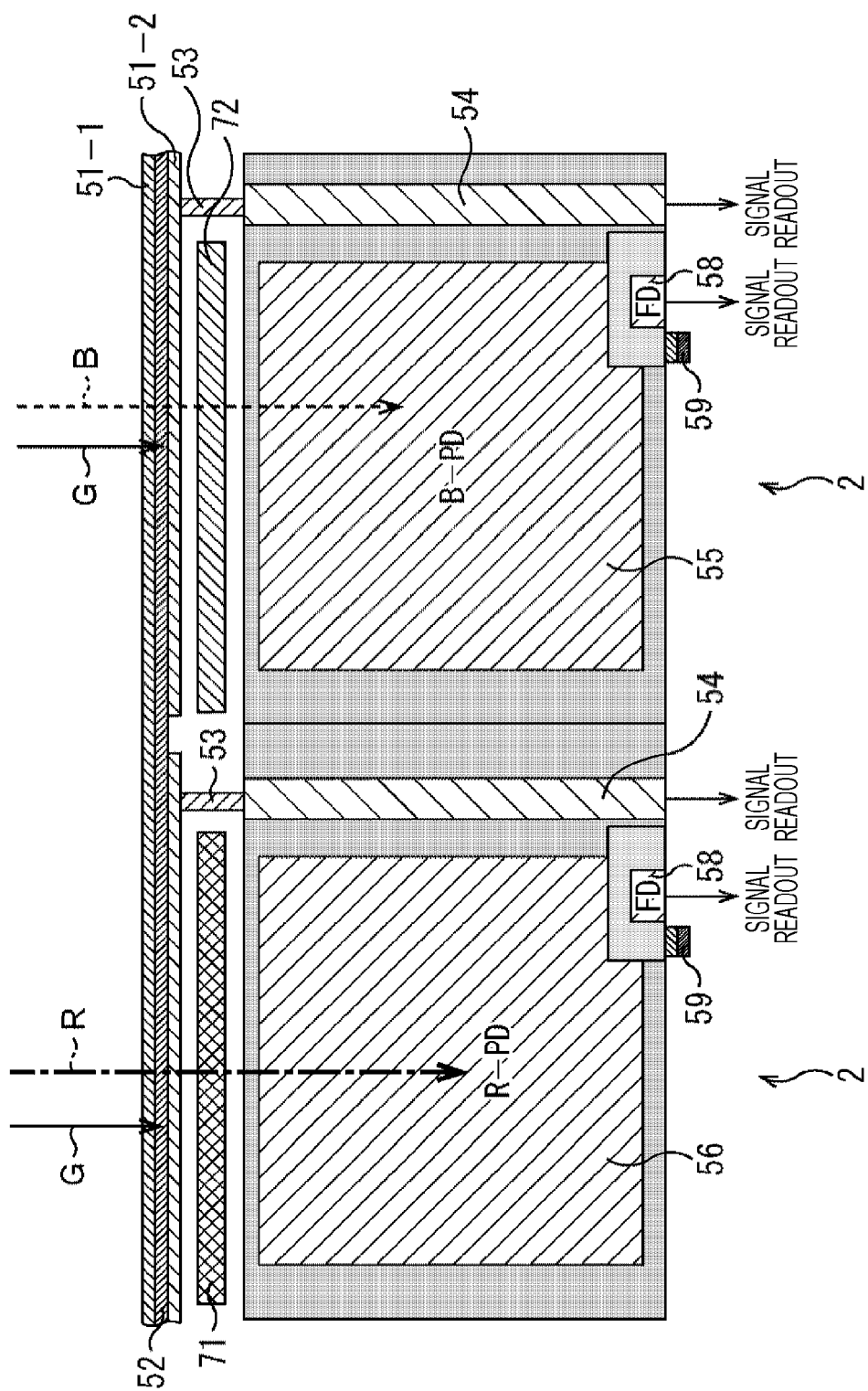
FIG. 16 is a cross-sectional view of an example device structure according to the fourth embodiment.

FIG. 16 is a cross-sectional view of a device structure to which the present technology is applied.

The example case shown in FIG. 16 is exactly the same as the example case shown in FIG. 10 in including an upper transparent electrode 51-1, a lower transparent electrode 51-2, an organic photoelectric conversion film 52, power supply plugs 53, through electrodes 54, B-PDs 55, R-PDs 56, FDs 58, gates 59, R-OCCFs 71, and R-OCCFs 72.

That is, in the example shown in FIG. 16, as the OCCFs are provided, the spectral characteristics are also made closer to ideal spectroscopy, and the noise propagation at the time of color correction operation in signal processing can be reduced. As a result, an image with a high S/N ratio can be provided.

It should be noted that, although the color filters are blue and red filters in the above described example shown in FIG. 16, the blue filters may be replaced with cyan filters, because the green pixels formed with the organic photoelectric conversion film 52 have spectral transmission characteristics to absorb green light and accordingly serve as magenta filters. Similarly, the red filters may be replaced with yellow filters. Alternatively, both the blue and red filters may be replaced at the same time.

5. Fifth Embodiment

[Another Example of a Pixel Array According to the Present Technology]

Figure 17:
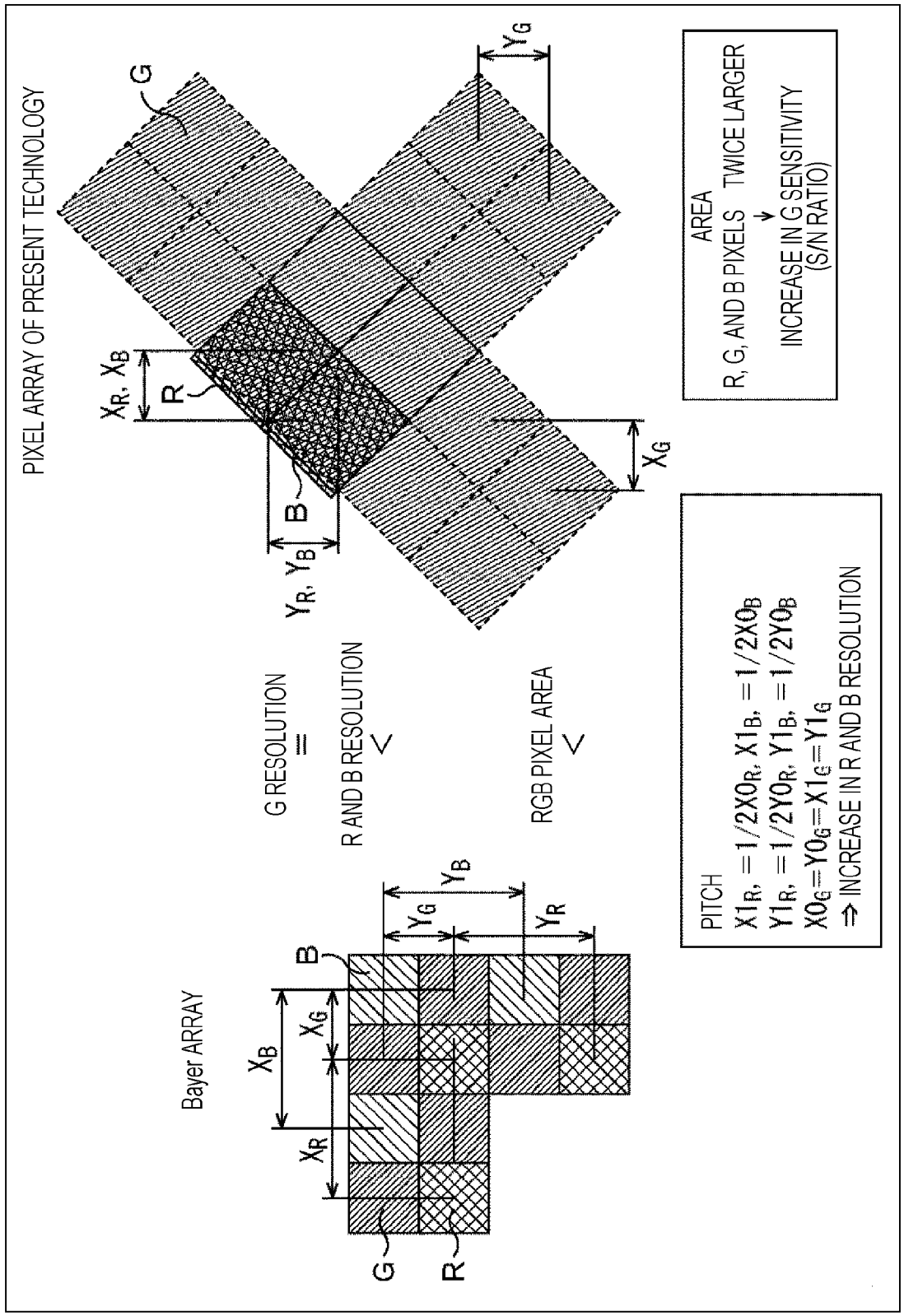
FIG. 17 is a diagram showing a fifth embodiment of a pixel array according to the present technology.

FIG. 17 is a diagram showing a fifth embodiment of a pixel array (an oblique array) according to the present technology. It should be noted that the example in FIG. 17 shows a Bayer array on the left side for comparison.

In a similar manner to the pixel array shown in FIG. 4, the pixel array shown in FIG. 17 is an oblique array in which the green pixels are $\sqrt{2}$ times larger in size (twice larger in area) than the green pixels in the Bayer array shown on the left side, and are arranged in an oblique direction at 45 degrees to those in the Bayer array. Furthermore, the pixel array shown in FIG. 17 is an oblique array in which the red pixels and the blue pixels are also $\sqrt{2}$ times larger in size (twice larger in area) than those in the Bayer array shown on the left side, and are arranged in an oblique direction at 45 degrees to those in the Bayer array.

Accordingly, the pitch $X1_R$ of the red pixels in the X-direction in the oblique array of the present technology=the pitch $X0_R \times \frac{1}{2}$ of the red pixels in the X-direction in the Bayer array, and the pitch $X1_B$ of the blue pixels in the X-direction in the oblique array of the present technology=the pitch $X0_B \times \frac{1}{2}$ of the blue pixels in the X-direction in the Bayer array, as shown in FIG. 17. The pitch $Y1_R$ of the red pixels in the Y-direction in the oblique array of the present technology=the pitch $Y0_R \times \frac{1}{2}$ of the red pixels in the Y-direction in the Bayer array, and the pitch $Y1_B$ of the blue pixels in the Y-direction in the oblique array of the present technology=the pitch $Y0_B \times \frac{1}{2}$ of the blue pixels in the Y-direction in the Bayer array.

Also, the pitch $X0_G$ of the green pixels in the X-direction in the Bayer array=the pitch $Y0_G$ of the green pixels in the Y-direction in the Bayer array=the pitch $X1_G$ of the green pixels in the X-direction in the oblique array of the present technology=the pitch $Y1_G$ of the green pixels in the Y-direction in the oblique array of the present technology.

Figure 18:
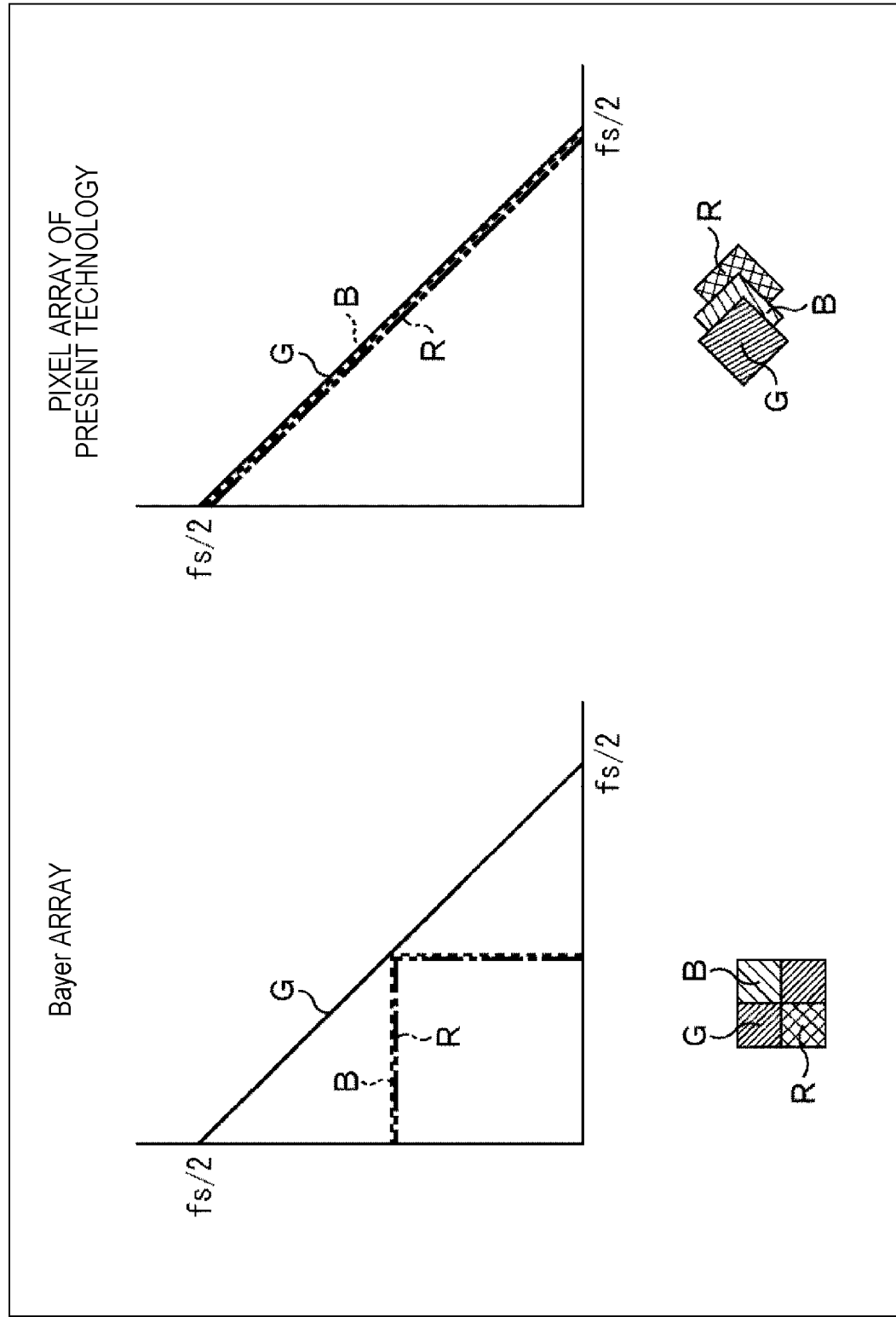
FIG. 18 is a diagram showing an example of CZP frequency characteristics in the fifth embodiment.

As described above, the pixel pitch of the red pixels and the blue pixels are half the pixel pitch of those in the Bayer array. Accordingly, in the oblique array of the present technology, the Nyquist domains of R and B are both twice larger in the vertical and horizontal directions in the CZP frequency characteristics, as shown in FIG. 18, and the resolution becomes higher than that in the Bayer array. This means that the resolution becomes higher in a desirable direction.

In this case, the pixel sizes of the red pixels, the blue pixels, and the green pixels become larger than those in the Bayer array. Accordingly, the areas of the red pixels, the blue pixels, and the green pixels become twice as large, and the sensitivities also become twice as high.

Figure 19:
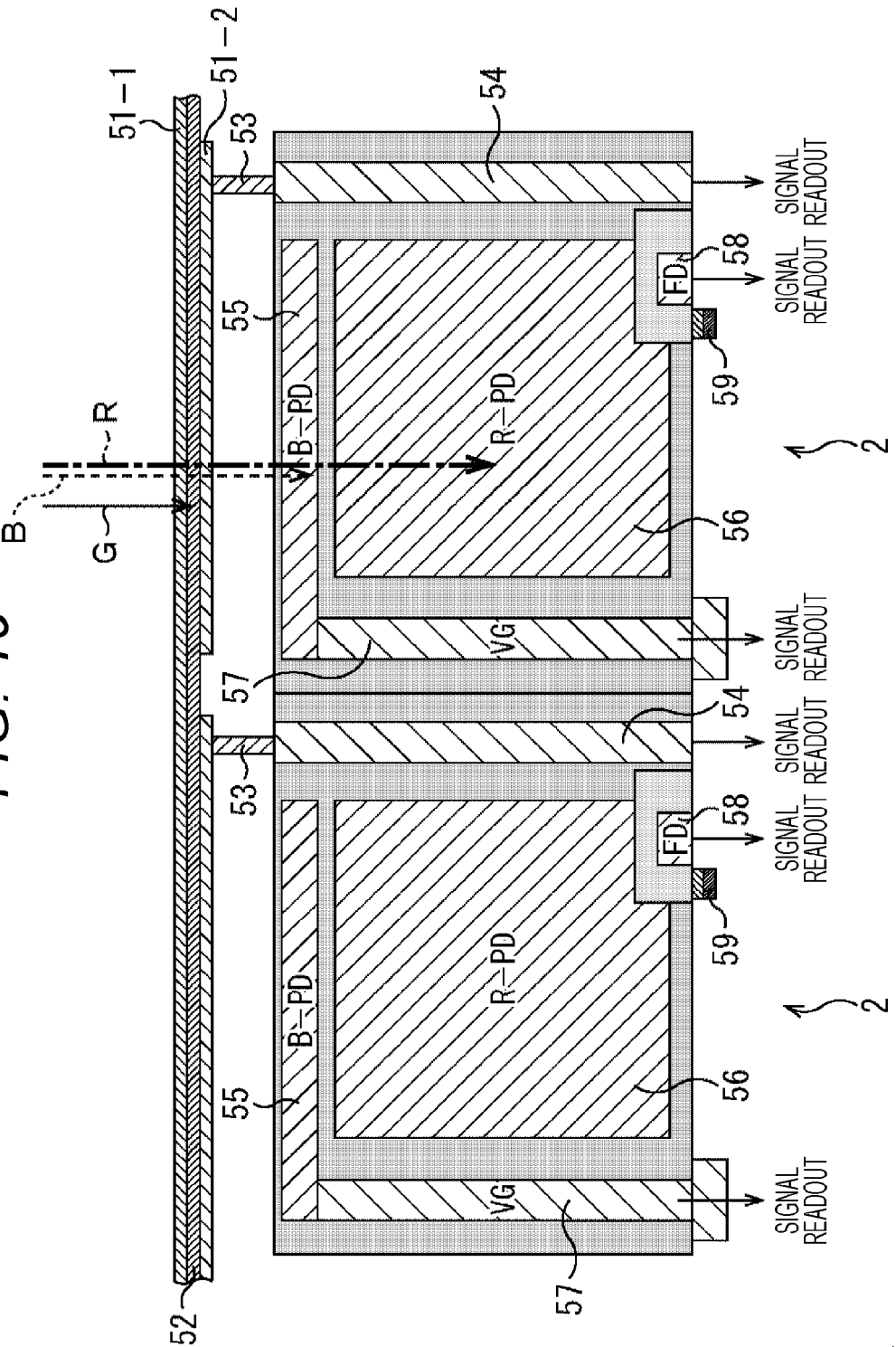
FIG. 19 is a cross-sectional view of an example device structure according to the fifth embodiment.

FIG. 19 is a cross-sectional view of a device structure to which the present technology is applied.

The example case shown in FIG. 19 is the same as the example case shown in FIG. 6 in including an upper transparent electrode 51-1, a lower transparent electrode 51-2, an organic photoelectric conversion film 52, power supply plugs 53, through electrodes 54, B-PDs 55, R-PDs 56, VGs 57, FDs 58, and gates 59. That is, the example shown in FIG. 19 differs from the example shown in FIG. 6 only in that the red and blue pixels are arranged in an oblique array, though the oblique array is not shown in FIG. 19.

As such a stack structure is formed, the resolutions of red and blue become higher than those in the Bayer array, and the sensitivities of the red, green, and blue pixels become twice higher than those in the Bayer array.

6. Sixth Embodiment

[Example Configurations of a Device that Uses a Pixel Array According to the Present Technology]

In the structures of the above described first through fifth embodiments, lenses may be further inserted so that the sensitivities can be increased. However, the green pixels in the uppermost layer have overall apertures (100% in aperture rate). Therefore, lenses may be provided on the respective green pixels, but such lenses are not necessary.

For the blue pixels or the red pixels on the Si substrate side below the green pixels, through electrodes, transistors, and the like are provided. Therefore, the blue pixels and the red pixels are not PDs that have overall apertures and can sense light. In a case where no lenses are provided in such a situation, the decrease in sensitivity becomes conspicuous. In view of this, lenses 91 are provided between the green pixels (the organic photoelectric conversion film 52) and Si-PDs (the B-PDs 55, for example), as shown in FIG. 20, so as to achieve a higher sensitivity.

Figure 20:
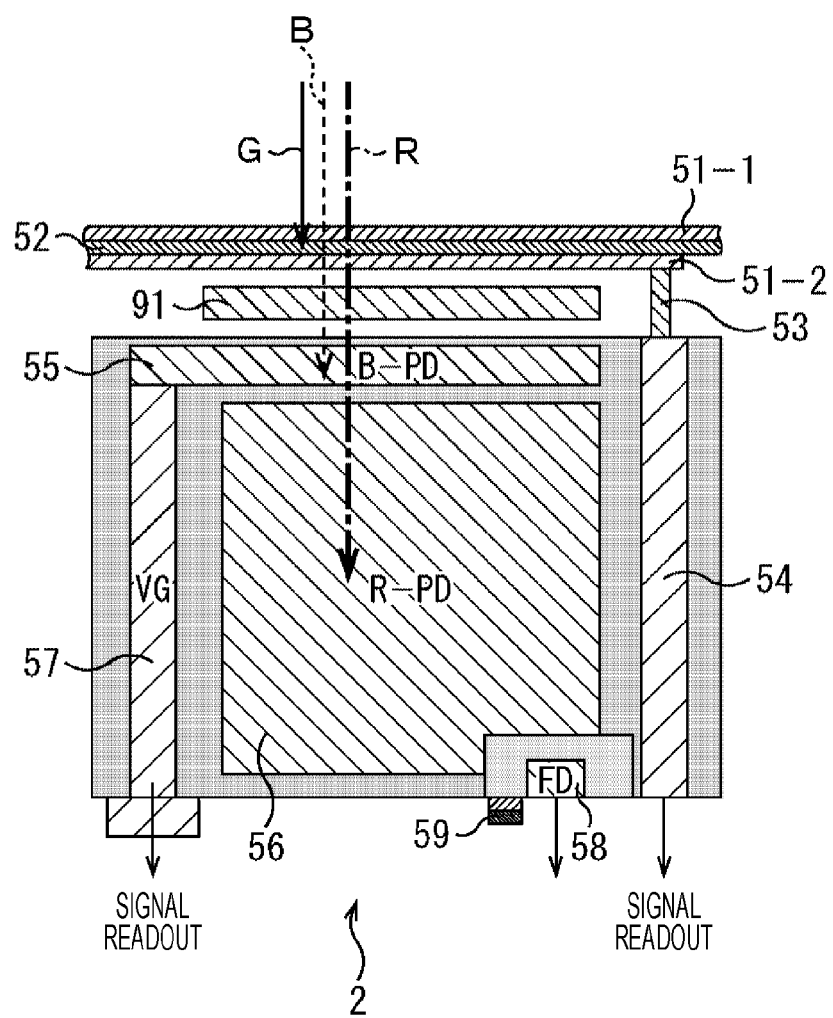
FIG. 20 is a cross-sectional view of an example device structure of a sixth embodiment of a pixel array according to the present technology.

FIG. 20 is a cross-sectional view of a device structure to which the present technology is applied.

The example case shown in FIG. 20 is the same as the example case shown in FIG. 6 in including an upper transparent electrode 51-1, a lower transparent electrode 51-2, an organic photoelectric conversion film 52, power supply plugs 53, through electrodes 54, B-PDs 55, R-PDs 56, FDs 58, and gates 59.

The example case shown in FIG. 20 differs from the example shown in FIG. 6 only in that the lenses 91 are added between the lower transparent electrode 51-2 and the B-PDs 55.

Figure 21:
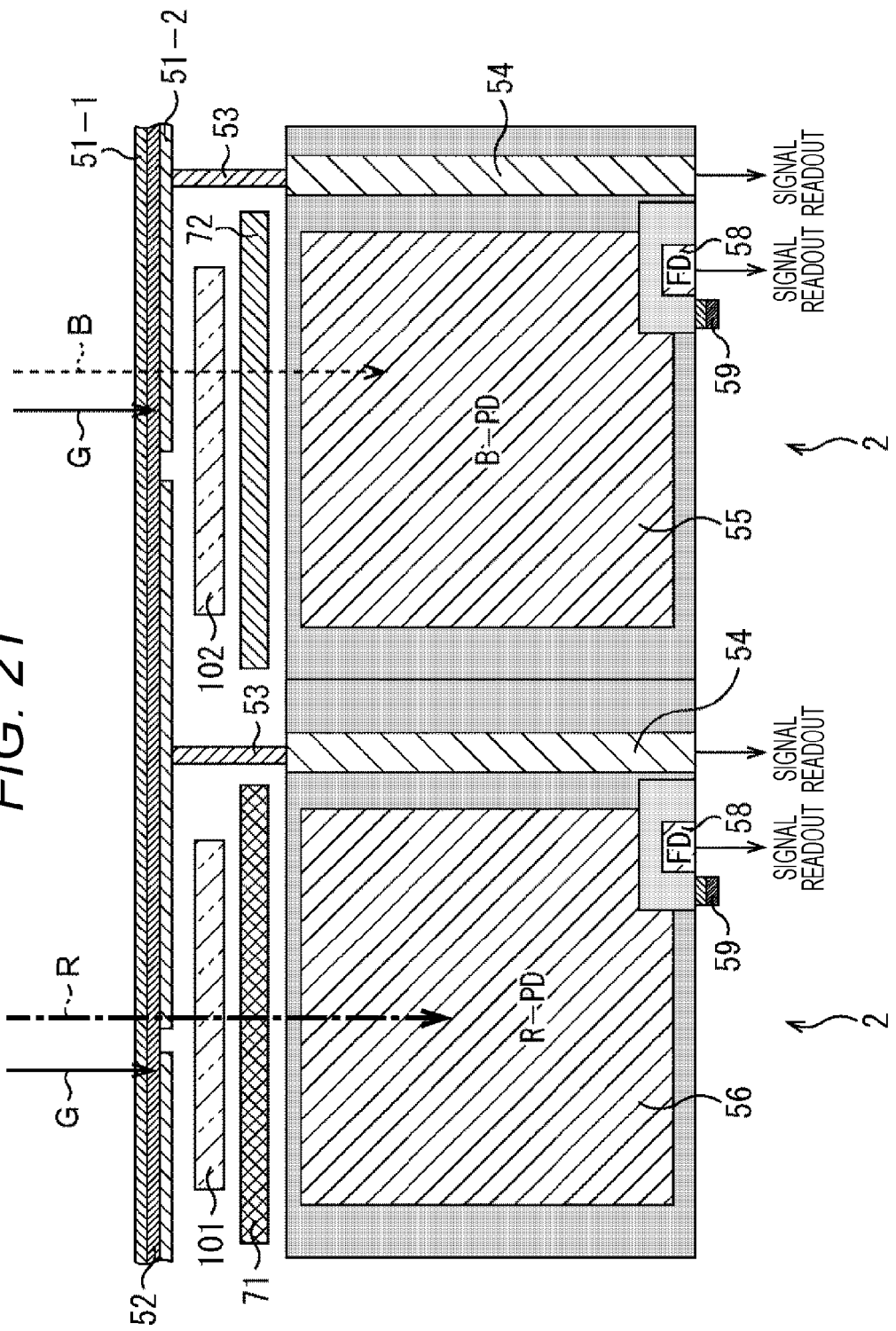
FIG. 21 is a cross-sectional view of another example device structure of the sixth embodiment of a pixel array according to the present technology.

FIG. 21 is a cross-sectional view of a device structure to which the present technology is applied.

The example case shown in FIG. 21 is the same as the example case shown in FIG. 10 in including an upper transparent electrode 51-1, a lower transparent electrode 51-2, an organic photoelectric conversion film 52, power supply plugs 53, through electrodes 54, B-PDs 55, R-PDs 56, FDs 58, gates 59, R-OCCFs 71, and B-OCCFs 72.

The example case shown in FIG. 21 differs from the example shown in FIG. 10 only in that lenses 101 are added between the lower transparent electrode 51-2 and the R-OCCFs 71, and lenses 102 are added between the lower transparent electrode 51-2 and the B-OCCFs 72.

That is, to increase the sensitivity of the B-PDs or the R-PDs, the lenses 91 are provided between the green pixels and the PDs as in the structure shown in FIG. 20, or the lenses 101 or the lenses 102 are provided on OCCFs as in the structure shown in FIG. 21. It should be noted that, as for the positional relationship between lenses and OCCFs, the lenses may be provided below the OCCFs, but are preferably provided above the OCCFs to reduce color mixing.

Meanwhile, the lens material preferably has a higher refractive index than that of the portions surrounding the lenses. Further, as shown in FIG. 22, the lens shape may be a plate-like shape or may have a curved surface like a spherical surface.

Figure 22:
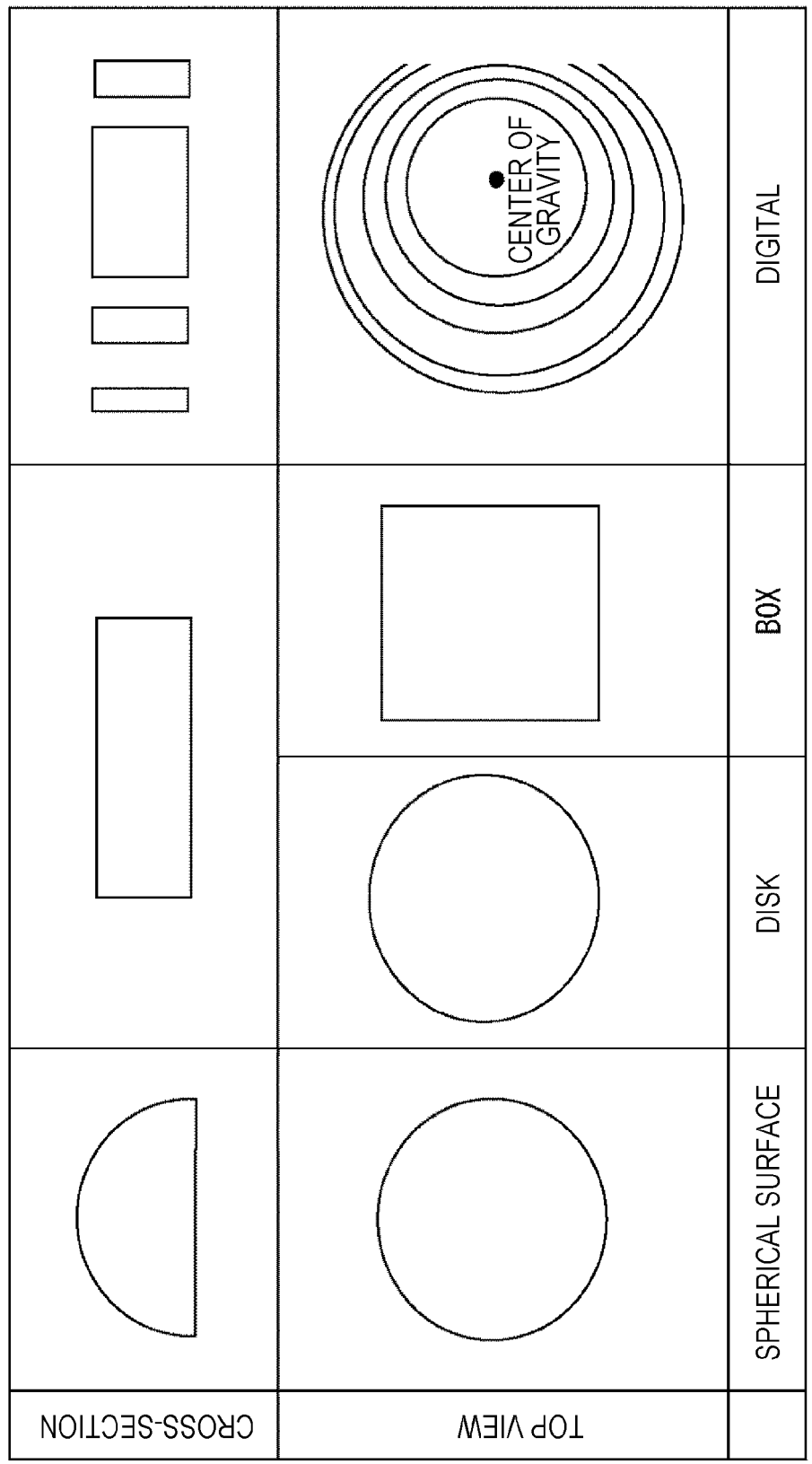
FIG. 22 is a diagram showing example shapes of lenses.

Specifically, FIG. 22 shows examples of cross-sections and top views of lenses. Each lens may have a spherical surface, or may be in a disk-like form, a box-like form, or a digital form, as shown in FIG. 22.

At a peripheral portion away from the center of the imaging surface, the principal ray obliquely enters. Therefore, pupil correction may be conducted to move the principal ray toward the center of the imaging surface. Also, at a portion closer to the edge of the imaging area, the incident angle of the principal ray is greater, and the principal ray may be greatly moved accordingly. By doing so, it is possible to reduce shading characteristics, such as larger sensitivity decreases at portions closer to the edge of the imaging surface.

Also, in the digital form shown in the rightmost column in FIG. 22, a high refractive index material and a low refractive index material are alternately arranged, to form an asymmetrical shape. That is, the position of the center of gravity is moved from the center of the pixel toward the center of the imaging surface. In this manner, oblique incidence of the principal ray is corrected, and the principal ray can be made to enter the Si substrate surface perpendicularly. Also, the shading effect can be reduced. In this case, the center of gravity may also be greatly moved at portions closer to the edge, so that a structure symmetrical about the center of the imaging surface can be formed. It should be noted that the ring pattern shown in FIG. 22 indicates the lens shape in the case of oblique light incidence from right.

Figure 23:
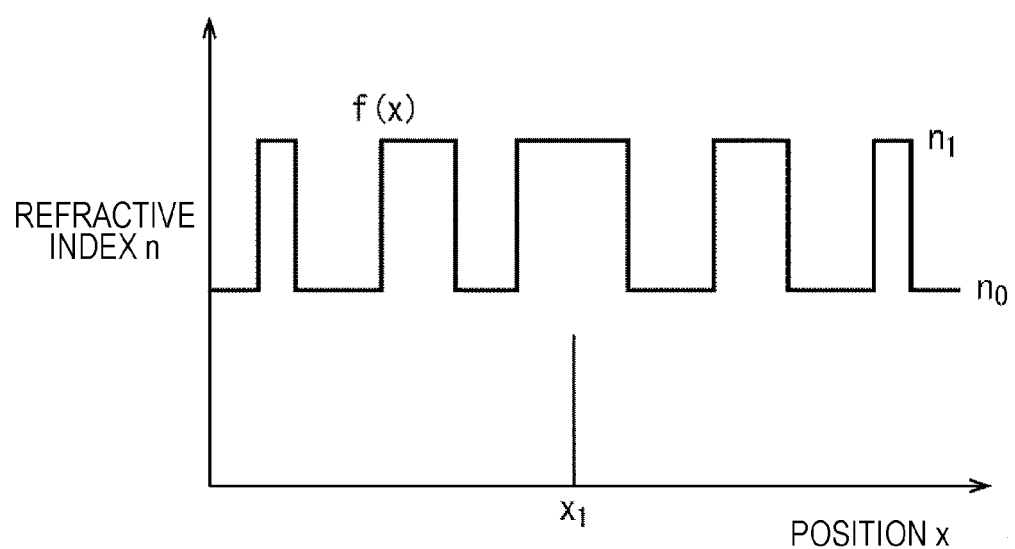
FIG. 23 is a conceptual diagram showing the position of the center of gravity in a one-dimensional case.

Referring now to FIG. 23, the definition of the center of gravity is described. In a pixel plane or a certain area D, the refractive index of the high refractive index layer is represented by n1, the refractive index of the low refractive index layer is represented by n2, and the distribution function of refractive index is represented by f(x, y). The position $(x_1, y_1)$ that satisfies the following equation (1) in the x-y coordinate system is defined as the center of gravity.

[Mathematical Formula 1]

$$\int\int_D (x_1 - x)(y_1 - y)f(x, y)\,dxdy = 0 \tag{1}$$

This means that, in the position of the center of gravity, the integral of the first-order moment of the refractive indexes at the surrounding portions is 0. FIG. 23 is a conceptual diagram showing the position of the center of gravity in a one-dimensional case. In practice, however, the position is expressed in a two-dimensional position coordinate system or the x-y coordinate system, and satisfies such conditions that the integrals of x and y become 0 at the same time.

7. Seventh Embodiment

[Example Configuration of a Device that Uses a Pixel Array According to the Present Technology]

Figure 24:
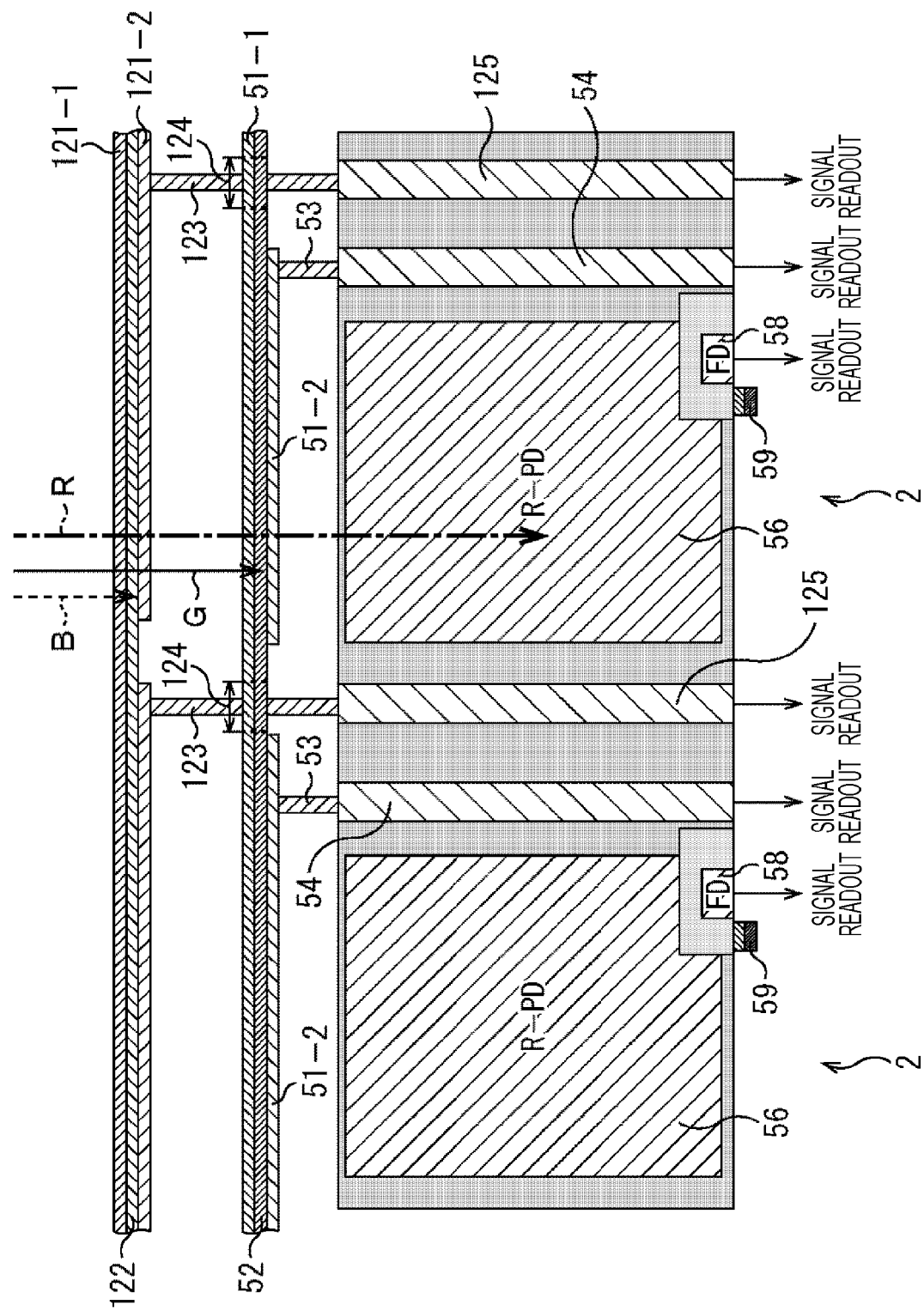
FIG. 24 is a diagram showing a seventh embodiment of a pixel array according to the present technology.

FIG. 24 is a cross-sectional view of a device structure to which the present technology is applied.

The example case shown in FIG. 24 is the same as the example case shown in FIG. 10 in including an upper transparent electrode 51-1, a lower transparent electrode 51-2, an organic photoelectric conversion film 52, power supply plugs 53, through electrodes 54, R-PDs 56, FDs 58, and gates 59.

The example case shown in FIG. 24 differs from the example shown in FIG. 10 in that the blue pixels are not formed with Si-PDs, but are formed with an organic photoelectric conversion film 122 interposed between an upper transparent electrode 121-1 and a lower transparent electrode 121-2. That is, the example case shown in FIG. 24 differs from the example shown in FIG. 10 in that the B-PDs 55 are replaced with the upper transparent electrode 121-1, the lower transparent electrode 121-2, and the organic photoelectric conversion film 122, and power supply plugs 123, holes 124, and through electrodes 125 are formed.

That is, in the example shown in FIG. 24, two layers (blue and green organic photoelectric conversion films) are formed on the Si substrate, and only the red pixels are formed with Si-PDs in a similar manner to the example shown in FIG. 10.

Specifically, the blue pixels have an organic photoelectric conversion film structure that is formed with the organic photoelectric conversion film 122 that converts blue light into signals and is interposed between the upper transparent electrode 121-1 and the lower transparent electrode 121-2. The upper transparent electrode 121-1 is a continuous film, and the lower transparent electrode 121-2 is divided for the respective pixels. Through each of the divided electrodes, a blue signal is read out.

The holes 124 are formed in part of the green pixels (or the upper transparent electrode 51-1, the lower transparent electrode 51-2, and the organic photoelectric conversion film 52) to connect the power supply plugs 123 to the Si substrate so that blue signals can be read out to the Si substrate side (on the lower side in the drawing). In a similar manner to the through electrodes 54, the through electrodes 125 are formed in the Si substrate, and are connected to FDs (not shown), from which blue signals are read out.

Figure 25:
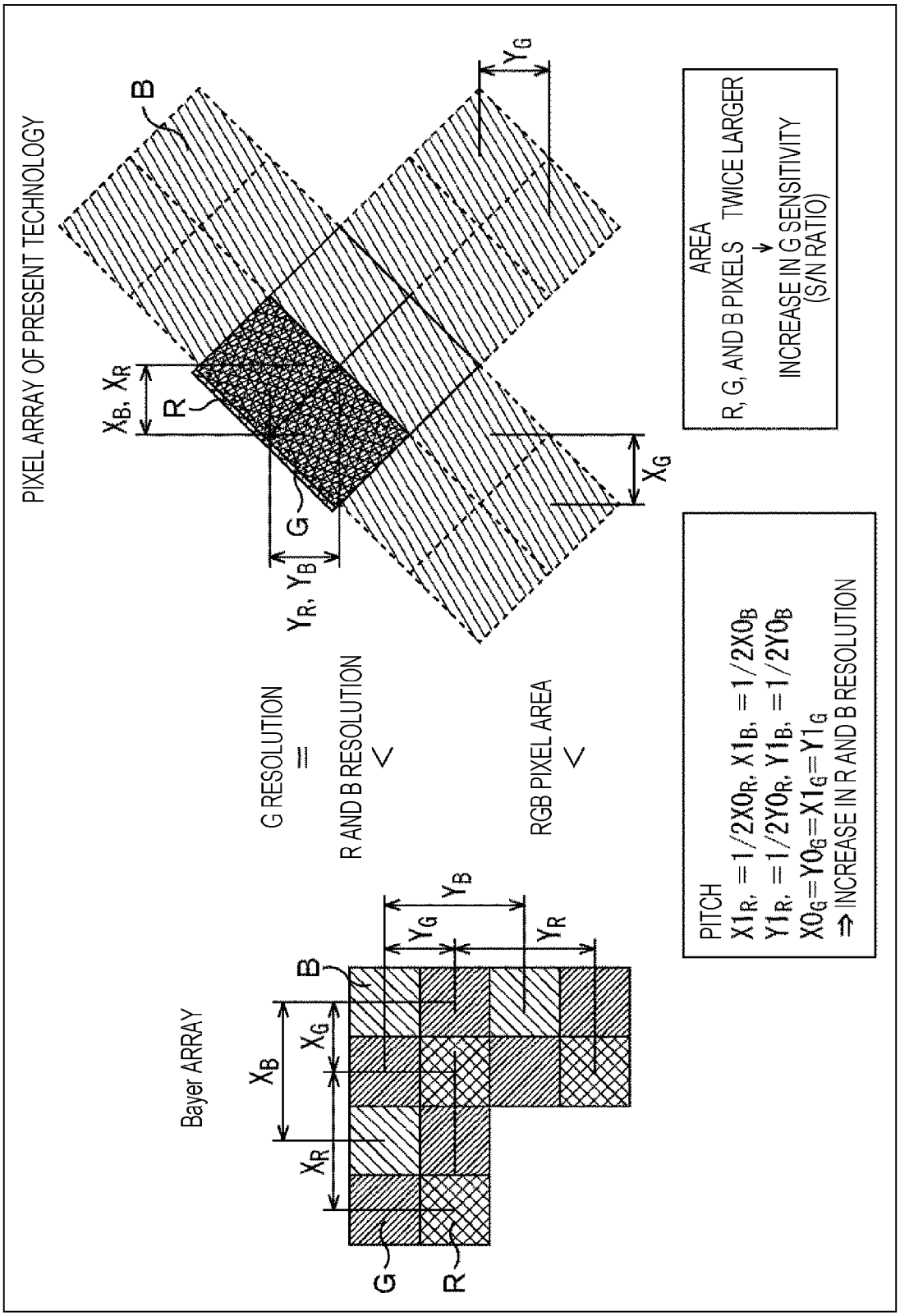
FIG. 25 is a diagram showing an example of CZP frequency characteristics in the seventh embodiment.

It should be noted that, as shown in FIG. 25, the pixel array in this case has the red pixels, the green pixels, and the blue pixels arranged in an oblique array, in a similar manner to the case of the fifth embodiment (FIG. 17). Therefore, as shown in FIG. 26, the CZP frequency characteristics in this case are similar to the CZP frequency characteristics in the fifth embodiment (FIG. 18).

Accordingly, in the oblique array of the present technology, the Nyquist domains of R and B are both twice larger in the vertical and horizontal directions in the CZP frequency characteristics, as shown in FIG. 26, and the resolution becomes higher than that in the Bayer array. This means that the resolution becomes higher in a desirable direction.

Alternatively, only the green pixels may be arranged in an oblique array, and the red pixels and the blue pixels may be arranged in a square array. In that case, the CZP frequency characteristics are similar to the CZP frequency characteristics in the example of the first embodiment (FIG. 5). Further, only the blue pixels may be arranged in an oblique array. In that case, the CZP frequency characteristics of blue of the first embodiment are replaced with the CZP frequency characteristics of green of the first embodiment, and vice versa. It should be noted that, although the organic photoelectric conversion film 122 of the blue pixels is provided above the organic photoelectric conversion film 52 of the green pixels in the example shown in FIG. 24, either of these films may be located in the upper layer, and the film order may be changed.

8. Eighth Embodiment

[Example Configurations of a Device that Uses a Pixel Array According to the Present Technology]

Figure 27:
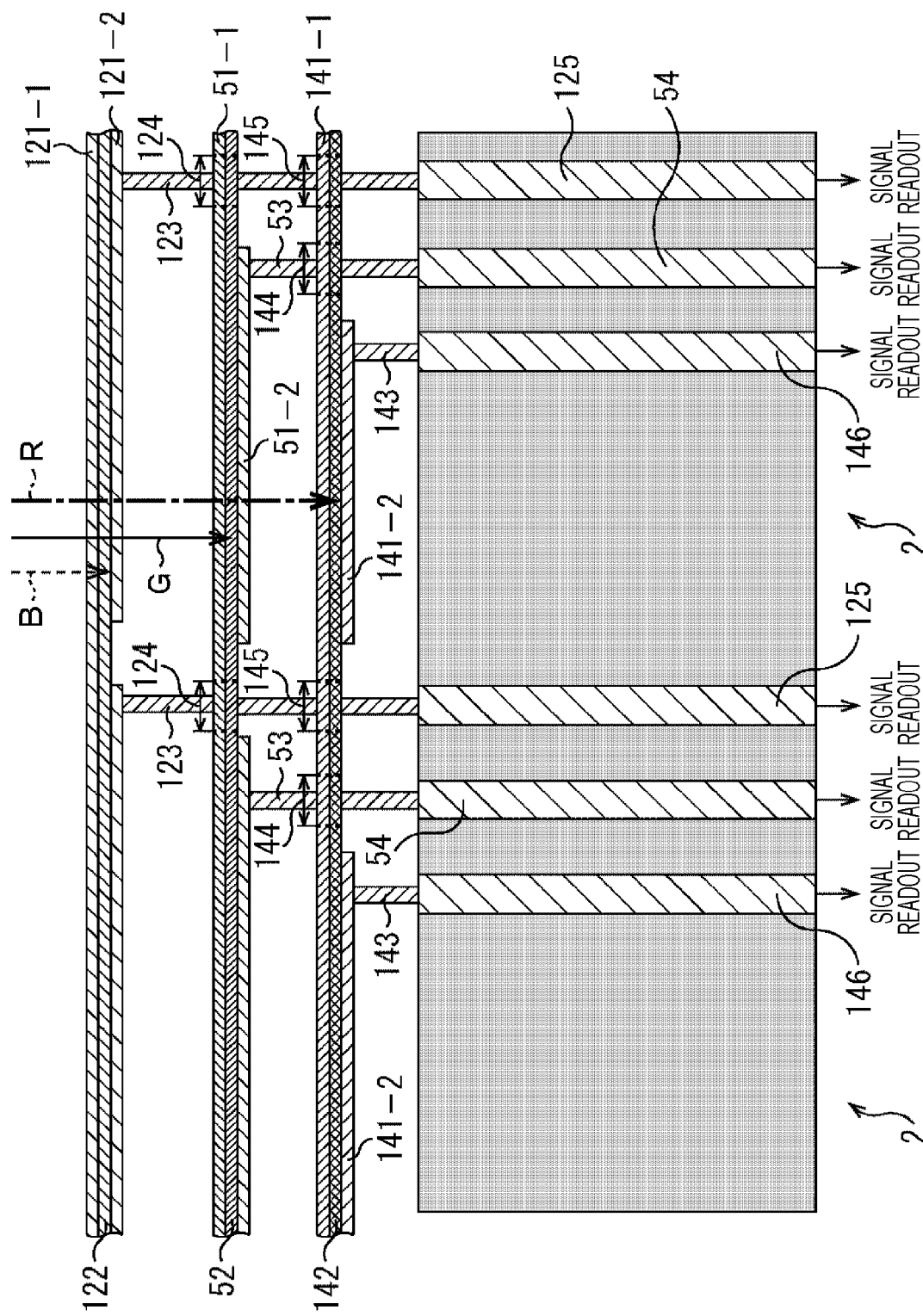
FIG. 27 is a diagram showing a seventh embodiment of a pixel array according to the present technology.

FIG. 27 is a cross-sectional view of a device structure to which the present technology is applied.

The example case shown in FIG. 27 is the same as the example case shown in FIG. 24 in including an upper transparent electrode 51-1, a lower transparent electrode 51-2, an organic photoelectric conversion film 52, power supply plugs 53, through electrodes 54, an upper transparent electrode 121-1, a lower transparent electrode 121-2, an organic photoelectric conversion film 122, power supply plugs 123, holes 124, and through electrodes 125.

The example case shown in FIG. 27 differs from the example shown in FIG. 24 in that the red pixels are not formed with Si-PDs, but are formed with an organic photoelectric conversion film 142 interposed between an upper transparent electrode 141-1 and a lower transparent electrode 141-2. That is, the example case shown in FIG. 27 differs from the example shown in FIG. 24 in that the R-PDs 56, the FDs 58, and the gates 59 are replaced with the upper transparent electrode 141-1, the lower transparent electrode 141-2, and the organic photoelectric conversion film 142, and power supply plugs 143, holes 144, holes 145, and through electrodes 146 are formed.

That is, in the example shown in FIG. 27, three layers (blue and green organic photoelectric conversion films) are formed on the Si substrate.

Specifically, the red pixels have an organic photoelectric conversion film structure that is formed with the organic photoelectric conversion film 142 that converts red light into signals and is interposed between the upper transparent electrode 141-1 and the lower transparent electrode 141-2. The upper transparent electrode 141-1 is a continuous film, and the lower transparent electrode 141-2 is divided for the respective pixels. Through each of the divided electrodes, a red signal is read out. In this case, the power supply plugs 143 for reading out red signals to the Si substrate side (on the lower side in the drawing) are provided.

The holes 144 are formed in part of the red pixels (or the upper transparent electrode 141-1, the lower transparent electrode 141-2, and the organic photoelectric conversion film 142) to connect the power supply plugs 53 to the Si substrate so that green signals can be read out to the Si substrate side (on the lower side in the drawing). Similarly, the holes 145 are formed in part of the red pixels (or the upper transparent electrode 141-1, the lower transparent electrode 141-2, and the organic photoelectric conversion film 142) to connect the power supply plugs 123 to the Si substrate so that blue signals can be read out to the Si substrate side (on the lower side in the drawing). In a similar manner to the through electrodes 54, the through electrodes 145 are formed in the Si substrate, and are connected to FDs (not shown), from which red signals are read out.

Figure 28:
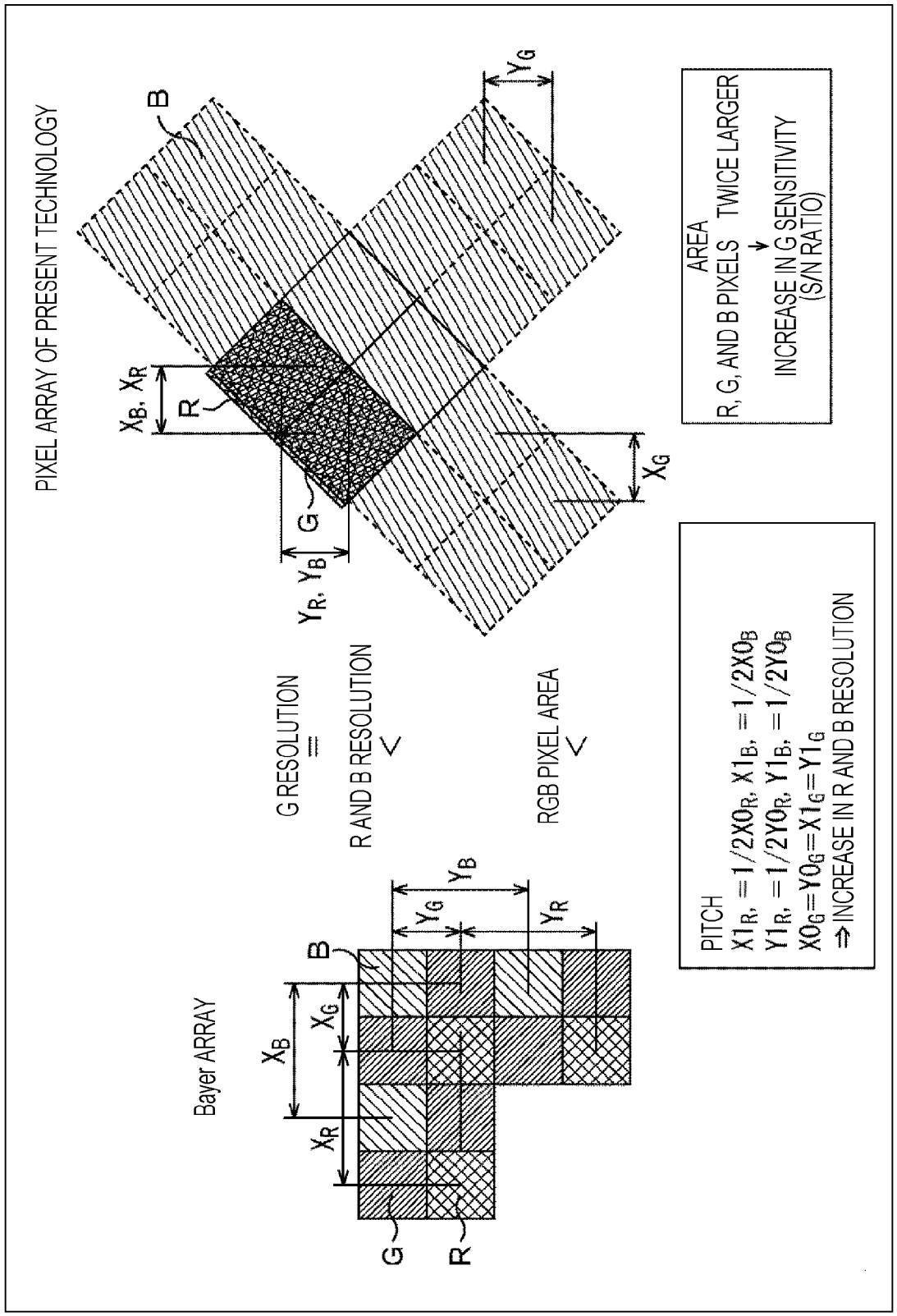
FIG. 28 is a diagram showing an example of CZP frequency characteristics in the seventh embodiment.

It should be noted that, as shown in FIG. 28, the pixel array in this case has the red pixels, the green pixels, and the blue pixels arranged in an oblique array, in a similar manner to the case of the fifth embodiment (FIG. 17). Therefore, as shown in FIG. 29, the CZP frequency characteristics in this case are similar to the CZP frequency characteristics in the fifth embodiment (FIG. 18).

Figure 29:
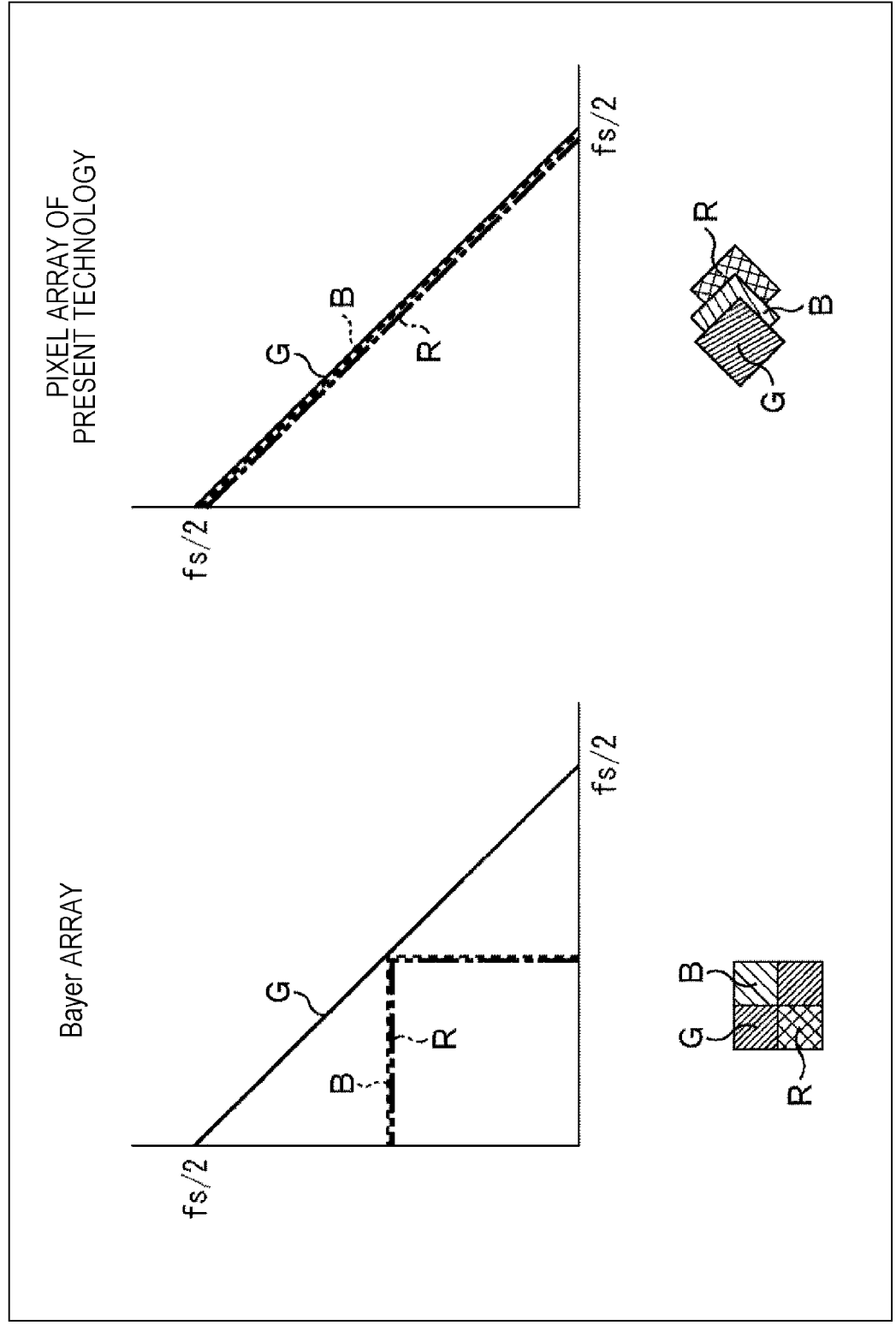
FIG. 29 is a cross-sectional view of an example device structure according to the seventh embodiment.

Accordingly, in the oblique array of the present technology, the Nyquist domains of R and B are both twice larger in the vertical and horizontal directions in the CZP frequency characteristics, as shown in FIG. 29, and the resolution becomes higher than that in the Bayer array. This means that the resolution becomes higher in a desirable direction.

Alternatively, only the green pixels may be arranged in an oblique array, and the red pixels and the blue pixels may be arranged in a square array. In that case, the CZP frequency characteristics are similar to the CZP frequency characteristics in the example of the first embodiment (FIG. 5). Further, only the blue pixels may be arranged in an oblique array. In that case, the CZP frequency characteristics of blue of the first embodiment are replaced with the CZP frequency characteristics of green of the first embodiment, and vice versa. Similarly, only the red pixels may be arranged in an oblique array. In that case, the CZP frequency characteristics of red of the first embodiment are replaced with the CZP frequency characteristics of green of the first embodiment, and vice versa. It should be noted that, although the organic photoelectric conversion film 122 of the blue pixels is provided above the organic photoelectric conversion film 52 of the green pixels, and the organic photoelectric conversion film 124 of the red pixels is provided below the organic photoelectric conversion film 52 of the green pixels in the example shown in FIG. 29, any of these films may be located in the uppermost layer, and the film order may be changed.

As described so far, according to the present technology, a resolution similar to or higher than the resolution in a Bayer array can be achieved, and a high S/N ratio can also be achieved at a high sensitivity level. Also, an increase in resolution by virtue of shifting of pixels can be expected.

Furthermore, according to the present technology, the pixel size can be made larger, while the resolution is equal to or higher than the resolution in a Bayer array. Accordingly, the production process is simplified, production on a large scale becomes possible, and the production costs become advantageously lower.

Although the present technology is applied to CMOS solid-state imaging devices in the above described configurations, the present technology may also be applied to solid-state imaging devices such as CCD (Charge Coupled Device) solid-state imaging devices.

Also, although the first photoelectric conversion unit is formed with green pixels in the above described examples, the first photoelectric conversion unit may be formed with red pixels or blue pixels, instead of green pixels.

It should be noted that the present technology is not necessarily applied to solid-state imaging devices, but may also be applied to imaging apparatuses. Here, an imaging apparatus is a camera system, such as a digital still camera or a digital video camera, or an electronic apparatus that has an imaging function, such as a portable telephone device. It should be noted that the form of a module to be mounted on an electronic apparatus, or a camera module, is an imaging apparatus in some cases.

9. Ninth Embodiment

<Examples of Use of the Image Sensor>

Figure 30:
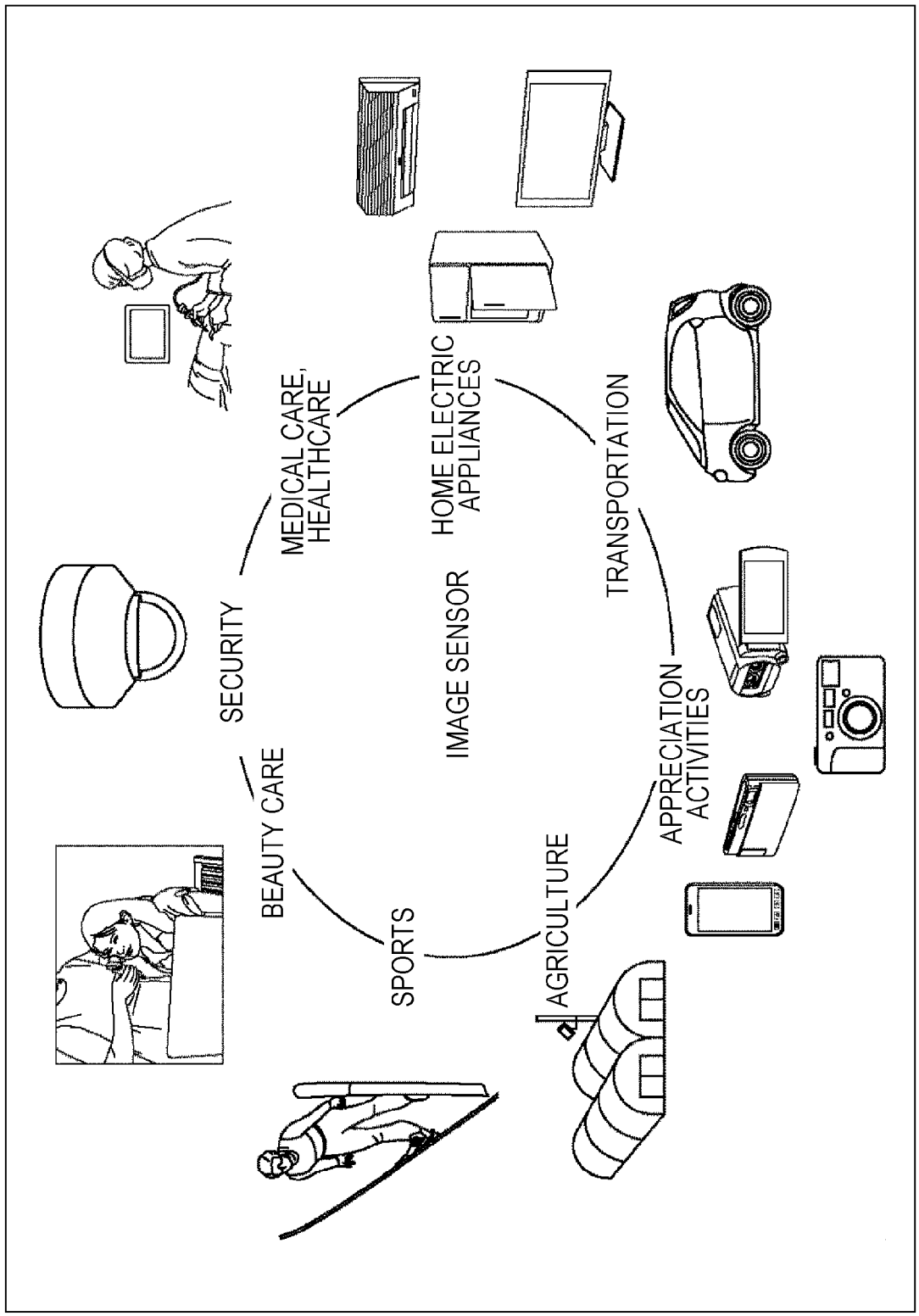
FIG. 30 is a diagram showing examples of use of solid-state imaging devices according to the present technology.

FIG. 30 is a diagram showing examples of use of the above-described solid-state imaging devices.

The above described solid-state imaging devices (image sensors) can be used in various cases where light, such as visible light, infrared light, ultraviolet light, or X-rays, is to be sensed, as listed below.

Devices configured to take images for appreciation activities, such as digital cameras and portable devices with camera functions.

Devices for transportation use, such as vehicle-mounted sensors configured to take images of the front, the back, the surroundings, and the inside of an automobile to perform safe driving like an automatic stop and recognize a driver's condition, surveillance cameras for monitoring running vehicles and roads, and ranging sensors for measuring distances between vehicles.

Devices to be used in conjunction with home electric appliances, such as television sets, refrigerators, and air conditioners, to take images of gestures of users and operate the appliances in accordance with the gestures.

Devices for medical care use and health care use, such as endoscopes and devices for receiving infrared light for angiography.

Devices for security use, such as surveillance cameras for crime prevention and cameras for personal authentication.

Devices for beauty care use, such as skin measurement devices configured to image a skin and microscopes for imaging a scalp.

Devices for sporting use, such as action cameras and wearable cameras for sports.

Devices for agricultural use such as cameras for monitoring conditions of fields and crops.

[Example Configuration of an Electronic Apparatus]

FIG. 31 is a block diagram showing an example configuration of a camera apparatus as an electronic apparatus to which the present technology is applied.

The camera apparatus 600 in FIG. 31 includes an optical unit 601 formed with lenses and the like, a solid-state imaging device (an imaging device) 602 that has any of the structures according to the present technology, and a DSP circuit 603 that is a camera signal processing circuit. The camera apparatus 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected to one another via a bus line 609.

The optical unit 601 gathers incident light (image light) from an object, and forms an image on the imaging surface of the solid-state imaging device 602. The solid-state imaging device 602 converts the amount of the incident light, which has been gathered as the image on the imaging surface by the optical unit 601, into an electrical signal for each pixel, and outputs the electrical signal as a pixel signal. A solid-state imaging device according to any of the above described embodiments can be used as the solid-state imaging device 602. Thus, a high S/N ratio can be achieved at a high sensitivity level, without any decrease in resolution.

The display unit 605 is formed with a panel display device such as a liquid crystal panel or an organic electro-luminescence (EL) panel, and displays a moving image or a still image formed by the solid-state imaging device 602. The recording unit 606 records a moving image or a still image formed by the solid-state imaging device 602 on a recording medium, such as a video tape or a digital versatile disk (DVD).

When operated by a user, the operation unit 607 issues operating instructions as to various functions of the camera apparatus 600. The power supply unit 608 supplies various power sources as the operation power sources for the DSP circuit 603, the frame memory 604, the display unit 605, the recording unit 606, and the operation unit 607, as appropriate.

It should be noted that embodiments of the present disclosure are not limited to the above-described embodiments, and various modifications may be made to them without departing from the scope of the present disclosure.

Furthermore, any configuration described above as one device (or one processing unit) may be divided into two or more devices (or processing units). Conversely, any configuration described above as two or more devices (or processing units) may be combined into one device (or processing unit). Also, it is of course possible to add components other than those described above to the configuration of any of the devices (or processing units). Furthermore, some components of a device (or processing unit) may be incorporated into the configuration of another device (or processing unit) as long as the configuration and the functions of the entire system remain substantially the same. That is, the present technology is not limited to the embodiments described above, but various modifications may be made to them without departing from the scope of the technology.

While preferred embodiments of the present disclosure have been described above with reference to the accompanying drawings, the present disclosure is not limited to those examples. It is apparent that those who have ordinary skills in the art can make various changes or modifications within the scope of the technical spirit claimed herein, and it should be understood that those changes or modifications are within the technical scope of the present disclosure.

It should be noted that the present technology may also be embodied in the configurations described below.

(1) A solid-state imaging device including:
  a first photoelectric conversion unit that converts light of a first wavelength and has respective pixels two-dimensionally arranged in a horizontal direction and a vertical direction, the respective pixels being tilted at approximately 45 degrees with respect to a square pixel array; and
  a second photoelectric conversion unit that converts light of a second wavelength and has respective pixels two-dimensionally arranged, the second photoelectric conversion unit being provided below the first photoelectric conversion unit.

(2) The solid-state imaging device of (1), wherein the light of the first wavelength is green light, and the first photoelectric conversion unit is formed with an organic photoelectric conversion film.

(3) The solid-state imaging device of (1) or (2), further including
  a third photoelectric conversion unit that converts light of a third wavelength and has respective pixels two-dimensionally arranged, the third photoelectric conversion unit being provided below the first photoelectric conversion unit.

(4) The solid-state imaging device of (3), wherein the light of the second wavelength or the light of the third wavelength is red light or blue light.

(5) The solid-state imaging device of (3) or (4), wherein the second photoelectric conversion unit and the third photoelectric conversion unit have the respective pixels two-dimensionally arranged in a horizontal direction and a vertical direction, the respective pixels being tilted at the same angle with respect to a square pixel array.

(6) The solid-state imaging device of (5), wherein the second photoelectric conversion unit and the third photoelectric conversion unit are arranged in a state tilted at approximately 0 degrees with respect to a square pixel array.

(7) The solid-state imaging device of any of (3) to (6), wherein the second photoelectric conversion unit and the third photoelectric conversion unit are formed with Si semiconductors.

(8) The solid-state imaging device of (1) or (2), wherein the second photoelectric conversion unit is formed with a Si semiconductor.

(9) The solid-state imaging device of (1), (2), or (8), wherein a filter that passes red light and a filter that passes blue light are provided between the first photoelectric conversion unit and the second photoelectric conversion unit, to cause a part of the second photoelectric conversion unit to function as a red photoelectric conversion unit, and another part of the second photoelectric conversion unit to function as a blue photoelectric conversion unit.

(10) The solid-state imaging device of (8) or (9), wherein the red photoelectric conversion unit and the blue photoelectric conversion unit have the respective pixels two-dimensionally arranged in a horizontal direction and a vertical direction, the respective pixels being tilted at the same angle with respect to a square pixel array.

(11) The solid-state imaging device of any of (8) to (10), wherein the red photoelectric conversion unit and the blue photoelectric conversion unit have the respective pixels arranged in a state tilted at approximately 45 degrees with respect to a square pixel array.

(12) The solid-state imaging device of any of (8) to (11), wherein the red photoelectric conversion unit and the blue photoelectric conversion unit have a pixel array with the respective pixels arranged in a state tilted at approximately 0 degrees with respect to a square pixel array, to form no color filter on the pixels of yet another part of the second photoelectric conversion unit.

(13) The solid-state imaging device of any of (1) to (12), further including
a lens between the first photoelectric conversion unit and the second photoelectric conversion unit.

(14) The solid-state imaging device of (2), further including
a third photoelectric conversion unit that converts light of a third wavelength and has respective pixels two-dimensionally arranged, the third photoelectric conversion unit being provided above the first photoelectric conversion unit.

(15) The solid-state imaging device of (14), wherein the light of the second wavelength and the light of the third wavelength are red light and blue light, respectively.

(16) The solid-state imaging device of (14) or (15), wherein the second photoelectric conversion unit and the third photoelectric conversion unit have the respective pixels two-dimensionally arranged at the same pitch in a horizontal direction and a vertical direction, the respective pixels being tilted at the same angle with respect to a square pixel array.

(17) The solid-state imaging device of any of (14) to (16), wherein the second photoelectric conversion unit and the third photoelectric conversion unit are arranged in a state tilted at approximately 0 degrees with respect to a square pixel array.

(18) The solid-state imaging device of any of (14) to (17), wherein the second photoelectric conversion unit is formed with a Si semiconductor, and the third photoelectric conversion unit is formed with an organic photoelectric conversion film.

(19) The solid-state imaging device of any of (14) to (17), wherein the second photoelectric conversion unit and the third photoelectric conversion unit are formed with organic photoelectric conversion films.

(20) An electronic apparatus including:
a solid-state imaging device including:
a first photoelectric conversion unit that converts light of a first wavelength and has respective pixels two-dimensionally arranged in a horizontal direction and a vertical direction, the respective pixels being tilted at approximately 45 degrees with respect to a square pixel array; and
a second photoelectric conversion unit that converts light of a second wavelength and has respective pixels two-dimensionally arranged, the second photoelectric conversion unit being provided below the first photoelectric conversion unit;
a signal processing circuit that processes an output signal output from the solid-state imaging device; and
an optical system that inputs incident light to the solid-state imaging device.

REFERENCE SIGNS LIST

1 Solid-state imaging device
2 Pixel
51-1 Upper transparent electrode
51-2 Lower transparent electrode
52 Organic photoelectric conversion film
53 Power supply plug
54 Through electrode
55 B-PD
56 R-PD
57 VG
58 FD
59 Gate
71 R-OCCF
72 B-OCCF
81 Mg-PD
91 Lens
101 Lens
102 Lens
121-1 Upper transparent electrode
121-2 Lower transparent electrode
122 Organic photoelectric conversion film
123 Power supply plug
124 Hole
125 Through electrode
141-1 Upper transparent electrode
141-2 Lower transparent electrode
142 Organic photoelectric conversion film
143 Power supply plug
144 Hole
145 Hole
146 Through electrode
600 Camera apparatus
602 Solid-state imaging device

The invention claimed is:
1. A solid-state imaging device, comprising:
a first photodiode provided in a substrate;
a first color filter provided above the first photodiode;
a second photodiode provided in the substrate;
a second color filter provided above the second photodiode;
an organic photoelectric conversion film provided above the first and second color filters, on a side of incident light of the first and second photodiodes;
a first through electrode connected to a first lower transparent electrode, wherein the first through electrode penetrates through the substrate; and a second through electrode connected to a second lower transparent electrode, wherein the second through electrode penetrates through the substrate, wherein, in a cross-sectional view, the first and second lower transparent electrodes are spaced apart from the first and second color filters, respectively, wherein the first photodiode belongs to a first pixel and the second photodiode belongs to a second pixel, wherein, in the cross-sectional view, the first through electrode is adjacent to a boundary between the first pixel and the second pixel, and wherein, in the cross-sectional view, a floating diffusion that stores charge generated by the first photodiode is provided in the substrate at a location that is closer to a first side of the first photodiode which is adjacent to the first through electrode than a second side of the first photodiode opposite the first side.

2. The solid-state imaging device according to claim 1, wherein the first through electrode is connected to a floating diffusion of the first pixel that stores charge generated by the organic photoelectric conversion film, and wherein the second through electrode is connected to a floating diffusion of the second pixel that stores charge generated by the organic photoelectric conversion film.

3. The solid-state imaging device according to claim 1, wherein the first pixel further comprises a gate electrode that controls transfer of charge from the floating diffusion that stores charge generated by the first photodiode, and wherein the floating diffusion that stores charge generated by the first photodiode is between the gate electrode and the first through electrode in the cross-sectional view.

4. The solid-state imaging device according to claim 1, wherein the first through electrode is located adjacent to the first color filter, and wherein the second through electrode is located adjacent to the second color filter.

5. The solid-state imaging device according to claim 4, wherein a first plug is provided between the first through electrode and the first lower transparent electrode, and wherein a second plug is provided between the second through electrode and the second lower transparent electrode.

6. The solid-state imaging device according to claim 5, wherein the substrate comprises silicon in which the first photodiode and the second photodiode are formed, and wherein the first plug is at a corner of the first pixel and the second plug is at a corner of the second pixel.

7. The solid-state imaging device according to claim 1, wherein the first photodiode and the second photodiode are located on a same plane in the substrate.

8. The solid-state imaging device according to claim 1, wherein either the first color filter or the second color filter is configured to pass blue light, and wherein the other of the first color filter or the second color filter is configured to pass red light.

9. The solid-state imaging device according to claim 5, wherein a width of the first plug is narrower than a width of the first through electrode in the cross-sectional view, and wherein a width of the second plug is narrower than a width of the second through electrode in the cross-sectional view.

10. A solid-state imaging device, comprising:
a first photodiode provided in a substrate;
a first color filter above the first photodiode;
a second photodiode provided in the substrate;
a second color filter above the second photodiode;
an organic photoelectric conversion film provided on a side of incident light of the first and second photodiodes;

a first through electrode connected to a first lower transparent electrode, wherein the first through electrode penetrates through the substrate; and a second through electrode connected to a second lower transparent electrode, wherein the second through electrode penetrates through the substrate, wherein an end of the first lower transparent electrode extends beyond the first through electrode in a horizontal direction, wherein an end of the second lower transparent electrode extends beyond the second through electrode in the horizontal direction, wherein, in a cross-sectional view the first and second lower transparent electrodes are spaced apart from the first and second color filters, respectively, wherein the first photodiode belongs to a first pixel and the second photodiode belongs to a second pixel, wherein, in the cross-sectional view, the first through electrode is adjacent to a boundary between the first pixel and the second pixel, and wherein, in the cross-sectional view, a floating diffusion that stores charge generated by the first photodiode is provided in the substrate at a location that is closer to a first side of the first photodiode which is adjacent to the first through electrode than a second side of the first photodiode opposite the first side.

11. The solid-state imaging device according to claim 10, wherein the first through electrode is connected to a floating diffusion of the first pixel that stores charge generated by the organic photoelectric conversion film, and wherein the second through electrode is connected to a floating diffusion of the second pixel that stores charge generated by the organic photoelectric conversion film.

12. An electronic apparatus, comprising:
a solid-state imaging device including:
a first photodiode provided in a substrate;
a first color filter provided above the first photodiode;
a second photodiode provided in the substrate;
a second color filter provided above the second photodiode;
an organic photoelectric conversion film provided above the first and second color filters, on a side of incident light of the first and second photodiodes;
a first through electrode connected to a first lower transparent electrode, wherein the first through electrode penetrates through the substrate; and
a second through electrode connected to a second lower transparent electrode, wherein the second through electrode penetrates through the substrate,
wherein the first and second lower transparent electrodes are spaced apart from the first and second color filters, respectively,
wherein the first photodiode belongs to a first pixel and the second photodiode belongs to a second pixel,
wherein, in a cross-sectional view, the first through electrode is adjacent to a boundary between the first pixel and the second pixel, and
wherein, in the cross-sectional view, a floating diffusion that stores charge generated by the first photodiode is provided in the substrate at a location that is closer to a first side of the first photodiode which is adjacent to the first through electrode than a second side of the first photodiode opposite the first side;
a signal processing circuit configured to process an output signal output from the solid-state imaging device; and
an optical system configured to input incident light to the solid-state imaging device.

13. The electronic apparatus according to claim 12, wherein the first through electrode is connected to a floating diffusion of the first pixel that stores charge generated by the organic photoelectric conversion film, and wherein the second through electrode is connected to a floating diffusion of the second pixel that stores charge generated by the organic photoelectric conversion film.

14. The electronic apparatus according to claim 12, wherein the first pixel further comprises a gate electrode that controls transfer of charge from the floating diffusion that stores charge generated by the first photodiode, and wherein the floating diffusion that stores charge generated by the first photodiode is between the gate electrode and the first through electrode in the cross-sectional view.

15. The electronic apparatus according to claim 12, wherein the first through electrode is located adjacent to the first color filter, and wherein the second through electrode is located adjacent to the second color filter.

16. The electronic apparatus according to claim 15, wherein a first plug is provided between the first through electrode and the first lower transparent electrode, and wherein a second plug is provided between the second through electrode and the second lower transparent electrode.

17. The electronic apparatus according to claim 12, wherein the substrate comprises silicon in which the first photodiode and the second photodiode are formed.

18. The electronic apparatus according to claim 12, wherein the first photodiode and the second photodiode are located on a same plane in the substrate.

19. The electronic apparatus according to claim 12, wherein either the first color filter or the second color filter is configured to pass blue light, and wherein the other of the first color filter or the second color filter is configured to pass red light.

20. The electronic apparatus according to claim 16, wherein a width of the first plug is narrower than a width of the first through electrode in the cross-sectional view, and wherein a width of the second plug is narrower than a width of the second through electrode in the cross-sectional view.

* * * * *